(12) United States Patent
Corona et al.

(10) Patent No.: US 8,829,609 B2
(45) Date of Patent: Sep. 9, 2014

(54) INSULATED GATE SEMICONDUCTOR DEVICE WITH OPTIMIZED BREAKDOWN VOLTAGE, AND MANUFACTURING METHOD THEREOF

(75) Inventors: Donato Corona, Catania (IT); Giovanni Samma Trice, Chiaramonte Gulfi (IT); Sebastiano Amara, Aci Bonaccorsi (IT); Salvatore Pisano, Catania (IT); Antonio Giuseppe Grimaldi, S. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 123 days.

(21) Appl. No.: 13/559,426

(22) Filed: Jul. 26, 2012

(65) Prior Publication Data
US 2013/0026536 A1     Jan. 31, 2013

(30) Foreign Application Priority Data
Jul. 28, 2011   (IT) .............................. TO2011A0684

(51) Int. Cl.
*H01L 29/732* (2006.01)
*H01L 29/739* (2006.01)
*H01L 29/08* (2006.01)
*H01L 29/66* (2006.01)
*H01L 29/06* (2006.01)

(52) U.S. Cl.
CPC ........ *H01L 29/7395* (2013.01); *H01L 29/0834* (2013.01); *H01L 29/6634* (2013.01); *H01L 29/0615* (2013.01); *H01L 29/66348* (2013.01); *H01L 29/7397* (2013.01)

USPC .................. 257/332; 257/378; 257/E29.185; 257/E29.201; 438/234; 438/272

(58) Field of Classification Search
CPC ..................................... H01L 29/6634
USPC ................... 257/E21.695, E29.185
See application file for complete search history.

(56) References Cited

U.S. PATENT DOCUMENTS

| 5,910,664 | A | * | 6/1999 | Ajit ............................ 257/212 |
| 8,232,161 | B2 | * | 7/2012 | Matsuura et al. ............. 438/238 |
| 2002/0175383 | A1 | * | 11/2002 | Kocon et al. ................... 257/376 |
| 2004/0145013 | A1 | | 7/2004 | Pfirsch |
| 2006/0292805 | A1 | * | 12/2006 | Kawamura et al. ........... 438/292 |
| 2008/0012040 | A1 | | 1/2008 | Saito et al. |
| 2010/0078756 | A1 | | 4/2010 | Schmidt |
| 2012/0267681 | A1 | * | 10/2012 | Nemoto et al. ............... 257/139 |

FOREIGN PATENT DOCUMENTS

EP          869 558 A2 * 10/1998  ............ H01L 29/739
JP       2009253004 A    10/2009

* cited by examiner

*Primary Examiner* — Stephen W Smoot
(74) *Attorney, Agent, or Firm* — Seed IP Law Group PLLC

(57) ABSTRACT

An insulated gate semiconductor device, comprising: a semiconductor body having a front side and a back side opposite to one another; a drift region, which extends in the semiconductor body and has a first type of conductivity and a first doping value; a body region having a second type of conductivity, which extends in the drift region facing the front side of the semiconductor body; a source region, which extends in the body region and has the first type of conductivity; and a buried region having the second type of conductivity, which extends in the drift region at a distance from the body region and at least partially aligned to the body region in a direction orthogonal to the front side and to the back side.

24 Claims, 18 Drawing Sheets

INSULATED GATE SEMICONDUCTOR DEVICE WITH OPTIMIZED BREAKDOWN VOLTAGE, AND MANUFACTURING METHOD THEREOF

BACKGROUND

1. Technical Field

The present disclosure relates to an insulated gate semiconductor device and to a manufacturing method thereof. In particular, the present disclosure regards an insulated gate bipolar transistor (IGBT) with optimized breakdown voltage.

2. Description of the Related Art

IGBTs are electronic devices widely used in various electronic systems. IGBT devices of an advanced type, with low losses and small dimensions, for example of the type with trench-gate terminal or of a planar type (see, for example, FIGS. 1a and 1b), are available on the market.

FIG. 1a shows, in cross-sectional view, a planar IGBT 1 of a known type, which comprises a substrate 2, made of silicon with a doping of a P++ type having a front side 2a and a back side 2b.

Formed on the front side 2a of the substrate 2 is a buffer layer 4, made of silicon of an N+ type, and formed on top of and in contact with the buffer layer 4 is a drift layer 6, made of silicon with a doping of an N− type. The drift layer 6 houses, at a top face 6a of its own, a body region 8, which extends in depth in the drift layer 6 starting from the top face 6a, and is formed by implantation of dopant species of a P type. Within the body region 8 a source region 10 is formed by implantation of dopant species of an N type, to form a region with N++ doping, which extends in the body region 8 starting from the top face 6a. The planar IGBT 1 further comprises a metal layer 12 formed on the top face 6a of the drift layer 6, in direct contact with the body region 8 and, partially, with the source region 10. The metal layer 12 is moreover separated from portions of the top face 6a that are external, in top plan view, to the body region 8 by means of layers of insulating material 14 and polysilicon 16 set on top of one another, in such a way that the polysilicon 16 is electrically insulated both from the top face 6a and from the metal layer 12 by the layers of insulating material 14. A gate region 18 of the planar IGBT 1 is thus formed. Finally, on the back side 2b of the substrate 2 a collector terminal 19, made of metal material, is formed in direct electrical contact with the substrate 2.

FIG. 1b shows a planar IGBT 20 similar to the planar IGBT 1 of FIG. 1a (elements that are in common are designated by the same reference numbers). The planar IGBT 20 further comprises a barrier layer 22, formed by implantation of dopant species of an N type, which is formed in the drift layer 6 so as to surround the body region 8 externally and be in contact therewith.

In use, the potential that is set up between the barrier layer 22 and the body region 8 acts as a barrier in regard to the holes injected from the region 2 into the drift layer 6. This results in an operative advantage during use of the planar IGBT 20, in so far as the portion of the drift layer 6 close to the body region 8 can be modulated in a more effective way as compared to the planar IGBT 1 of FIG. 1a. The barrier layer 22 reduces the depletion area underneath the body region 8 and generates an accumulation of holes such as to decrease the resistivity of the respective portion of drift layer 6, and hence enables reduction of the saturation voltage $V_{CEsat}$ when the planar IGBT 20 is forward biased.

According to this embodiment, however, since the concentration of spatial charge underneath the barrier layer 22 is high, in conditions of reverse biasing the breakdown voltage decreases. Said reduction in the breakdown voltage can be compensated by modulating the thickness and resistivity of the drift layer 6. This solution, albeit guaranteeing an adequate breakdown voltage, does not guarantee optimal values of the "energy off" (energy consumption at turning-off of the device) and of the peak electrical field underneath the body region 8. A very high electrical field could cause breakdown of the device during the reliability tests. In other words, when the device is in extreme working conditions (high humidity and/or high temperature in conditions of reverse biasing), very high localized electrical fields (i.e., ones well above the critical electrical field of silicon) can cause undesirable and unexpected breakdown.

BRIEF SUMMARY

Some embodiments of the present are an insulated gate semiconductor device, in particular an IGBT, and a manufacturing method thereof that will be able to overcome the drawbacks of the known art.

According to some embodiments of the present disclosure an insulated gate semiconductor device, in particular an IGBT, and a manufacturing method thereof are provided as defined in the annexed claims.

In particular, one embodiment of the present disclosure regards an insulated gate bipolar transistor (IGBT) comprising: a semiconductor body having a front side and a back side opposite to one another; a drift region, which extends in the semiconductor body and has a first type of conductivity and a first doping value; a body region having a second type of conductivity, which extends in the semiconductor body and faces the front side of the semiconductor body; a barrier region having the first type of conductivity and a second doping value higher than the first doping value, which extends between the body region and the drift region in electrical contact with the body region and the drift region; and a buried region having the second type of conductivity, which extends in the drift region, at least partially aligned to the body region in a vertical direction substantially orthogonal to the front side and to the back side. In particular, said vertical direction is the direction of conduction of current of the IGBT. In greater detail, the body region houses a region that is a source of charge carriers having the first type of conductivity. Moreover present is a collector region, which extends in an area corresponding to the back side of the semiconductor body in such a way that, in use, the current flows between the source region and the collector region. As is known, the semiconductor device is turned on by biasing a gate region, which extends in an area corresponding to the front side alongside the charge-carrier source region. The gate region can be, according to embodiments that are alternative to one another, formed on top of the front side (in this case the device is referred to as "planar") or in such a way as to extend within the semiconductor body in a respective trench (in this case the device is referred to as "trench gate"). In greater detail, irrespective of the embodiment, the buried region extends (in cross-sectional view and/or in plan view) alongside the gate region and vertically aligned to the body region, and is moreover separated from the body region by means of the barrier region. According to a further embodiment of the present disclosure, the buried region extends at a distance from the barrier region, at least partially aligned, in the vertical direction, to the body region. According to another embodiment of the present disclosure, the barrier region is not present, and the buried region extends at a distance from the body region, at least partially aligned, in the vertical direction, to the body region.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 2:
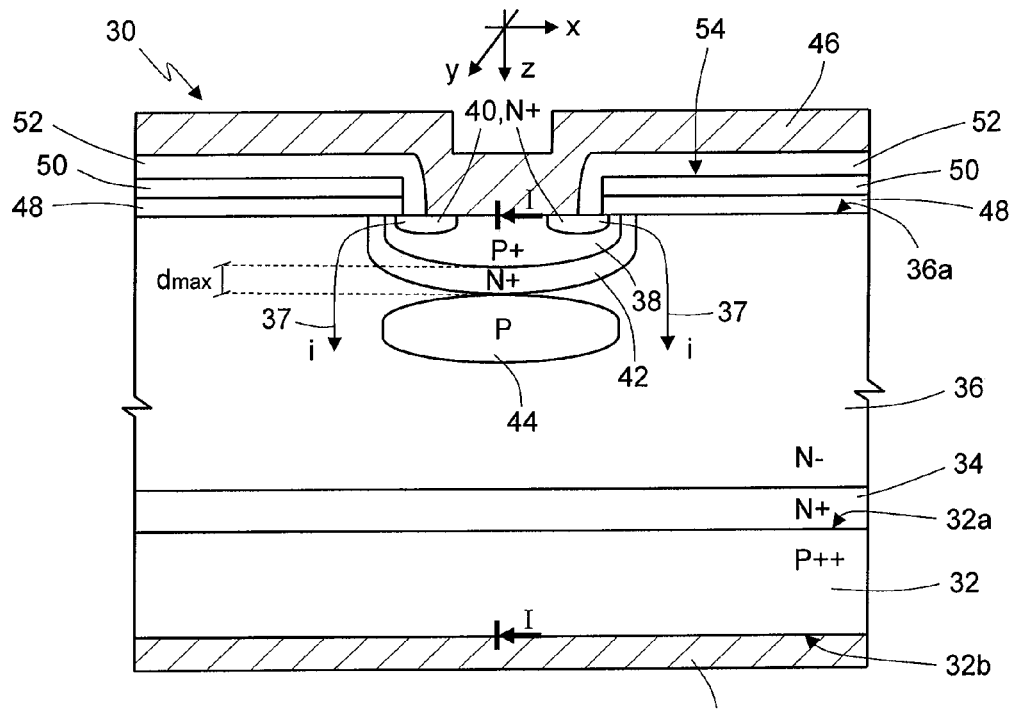
FIG. 2 shows, in cross-sectional view, an IGBT of a planar type according to one embodiment of the present disclosure.

FIG. 2 shows, in cross-sectional view, an insulated gate device, in particular an IGBT, designated by the reference number 30, according to one embodiment of the present disclosure.

The IGBT device 30 is of a planar type and comprises a substrate 32, made of doped semiconductor material, for example of silicon with P++ doping having a value of resistivity $\rho \leq 20$ m$\Omega$·cm. The substrate 32 has a front side 32a and a back side 32b. Extending over the front side 32a of the substrate 32 is a buffer layer 34 made of doped semiconductor material, for example of silicon with N+ doping. The buffer layer 34 has a thickness of between approximately 1 µm and 50 µm, and a value of resistivity of between approximately 10 m$\Omega$·cm and 1 $\Omega$·cm. The buffer layer 34 is, for example, grown epitaxially on the substrate 32. Extending on top of the buffer layer 34 is a drift layer 36 made of doped semiconductor material, for example of silicon with N− doping (in which charge-carrier drift phenomena occur). The substrate 32, the buffer layer 34, and the drift layer 36 form a semiconductor body of the IGBT device 30. The drift layer 36 has a thickness of between approximately 10 µm and 150 µm, and a value of resistivity of between approximately 10 $\Omega$·cm and 100 $\Omega$·cm. The drift layer 36 is, for example, grown epitaxially on the buffer layer 34. The drift layer 36 houses, on its top face 36a, a body region 38, with P+ doping, which extends in depth in the drift layer 36 starting from the top face 36a. Extending within the body region 38, starting from the top face 36a, is a source region 40 with N++ doping. Moreover present is a barrier region 42, with N+ doping, which extends in the drift layer 36 so as to surround the body region 38 and be in electrical contact with the body region 38.

According to the present disclosure, the IGBT device 30 further comprises a buried region 44 (floating region), with a doping of a P type, which extends within the drift layer 36 substantially vertically aligned to the body region 38 and in electrical contact with the barrier region 42. The distance between the buried region 44 and the body region 38 is, according to one embodiment of the present disclosure, greater than 1 µm (for example, 2 µm) in order to guarantee, in use, the effect of hole barrier provided by the barrier region 42. However, setting the buried region 44 at a maximum distance $d_{max}$ from the body region 38 (along the axis Z) not greater than 5 µm would optimize the advantages of the present disclosure. The maximum distance $d_{max}$ is measured along the axis Z between the deepest point reached by the body region 38 and the starting point, once again along the axis Z, of the extension of the buried region 44, which will extend further along the axis Z throughout its thickness. Values of maximum distance $d_{max}$ between the body region 38 and the buried region 44 lower than 1 µm or higher than 5 µm are possible, but reduce the advantageous effects due to the presence of the buried region 44 (in particular on account of a deterioration of the breakdown voltage of the device).

According to one embodiment, the barrier region 42 completely surrounds the body region 38 (obviously, underneath the top face 36a).

According to an alternative embodiment, the barrier region 42 only partially surrounds the body region 38; in particular, it extends between the buried region 44 and the body region 38, and not, in cross-sectional view, alongside the source region 40.

With reference to the axes shown in FIG. 2, the body region 38 extends in a horizontal direction (i.e., parallel to the plane XY) and vertically (i.e., in the direction defined by the axis Z). The buried region 44 extends in the drift layer 36 to a depth, measured along the axis Z, greater than the maximum depth reached by the body region 38. According to one embodiment, the buried region 44 is separated from the body region 38 by the barrier region 42, and is in contact with the barrier region 42.

According to a further embodiment (not shown), the buried region 44 is not in direct contact with the barrier region 42, but is separated therefrom by a portion of the drift layer 36. In this case, however, if on the one hand the saturation voltage ($V_{CEsat}$) of the device would in any case be low and at values comparable to those of a device of a known type with barrier region and without buried region 44, on the other hand the breakdown would be deteriorated. For this reason, it is preferable not to separate the buried region 44 from the barrier region 42, or, in the case where they are separate, to keep them at a distance apart of less than approximately 5 µm.

Irrespective of the embodiment, the body region 38 and the buried region 44 are at least partially aligned to one another, along the axis Z.

The drift layer 36 has (in a way not shown in the figure) a surface-enhancement region, formed by implantation of phosphorus (for example, with a concentration of approximately $1 \cdot 10^{13}$ ions/cm$^3$ (in general, higher than the value of concentration of the drift layer 36).

The IGBT device 30 further comprises a contact-terminal layer 46, made of conductive material, for example metal, which extends over the top face 36a of the drift layer 36, in direct contact with the body region 38 and, partially, with the source region 40. The contact-terminal layer 46 has, in use, the function of emitter contact of the IGBT device 30.

The contact-terminal layer 46 is moreover separated from portions of the top face 36a that are external to the body region 38 by layers of insulating material and conductive material set on top of one another. In greater detail, a first insulating layer 48, for example made of silicon oxide (SiO$_2$), extends alongside the body region 38 on the top face 36a of the drift layer 36. Extending on top of the first insulating layer 48 is an intermediate gate layer 50, for example made of polysilicon. Then, extending on top of the intermediate gate layer 50 is a second insulating layer 52, made, for example, of borophosphosilicate glass (BPSG). The second insulating layer 52 also extends alongside the intermediate gate layer 50 so as to insulate it completely from layers set above it. Extending in fact on top of the second insulating layer 52 is the contact-terminal layer 46. The contact-terminal layer 46, the second insulating layer 52, the intermediate gate layer 50, and the first insulating layer 48, set on top of one another, form a gate terminal 54 of the IGBT device 30. Moreover provided is an electrical contact (not shown in the figure) for biasing the gate terminal 54.

Finally, extending on the back side 32b of the substrate 32, in direct electrical contact with the substrate 32, is a collector-terminal layer 56 made of conductive material, for example metal.

In use, the IGBT device 30 having the structure described remains inhibited as long as the voltage between the gate terminal 54 and the emitter terminal 46 remains below a threshold value V$_{TH}$ of the IGBT device 30. In the inhibited state, the entire voltage between the collector terminal 56 and the emitter terminal 46 is withstood by the PN junction formed by the body region 38 and by the barrier layer 42/drift layer 36. When the voltage applied to the gate terminal 54 exceeds the threshold value V$_{TH}$, the IGBT device 30 goes into the conduction state. The passage of current occurs in a vertical direction through the drift layer 36 (between the source region 40, biased by the emitter terminal 46, and the collector terminal 56), as indicated by the arrows 37 in FIG. 2. In the following description, the direction of conduction of the IGBT device 30 is hence approximated as being substantially parallel to the direction defined by the axis Z (i.e., substantially orthogonal to the top face 36a of the structural layer 36 and to the back side 32b of the substrate 32). It is to be noted, for completeness, that the current that passes is bipolar, i.e., the electrons travel from the source to the collector, traversing the channel region and the drift region, whilst the holes travel from the substrate 32 to the body region 38 where they re-close towards the metal 46.

Figure 14:
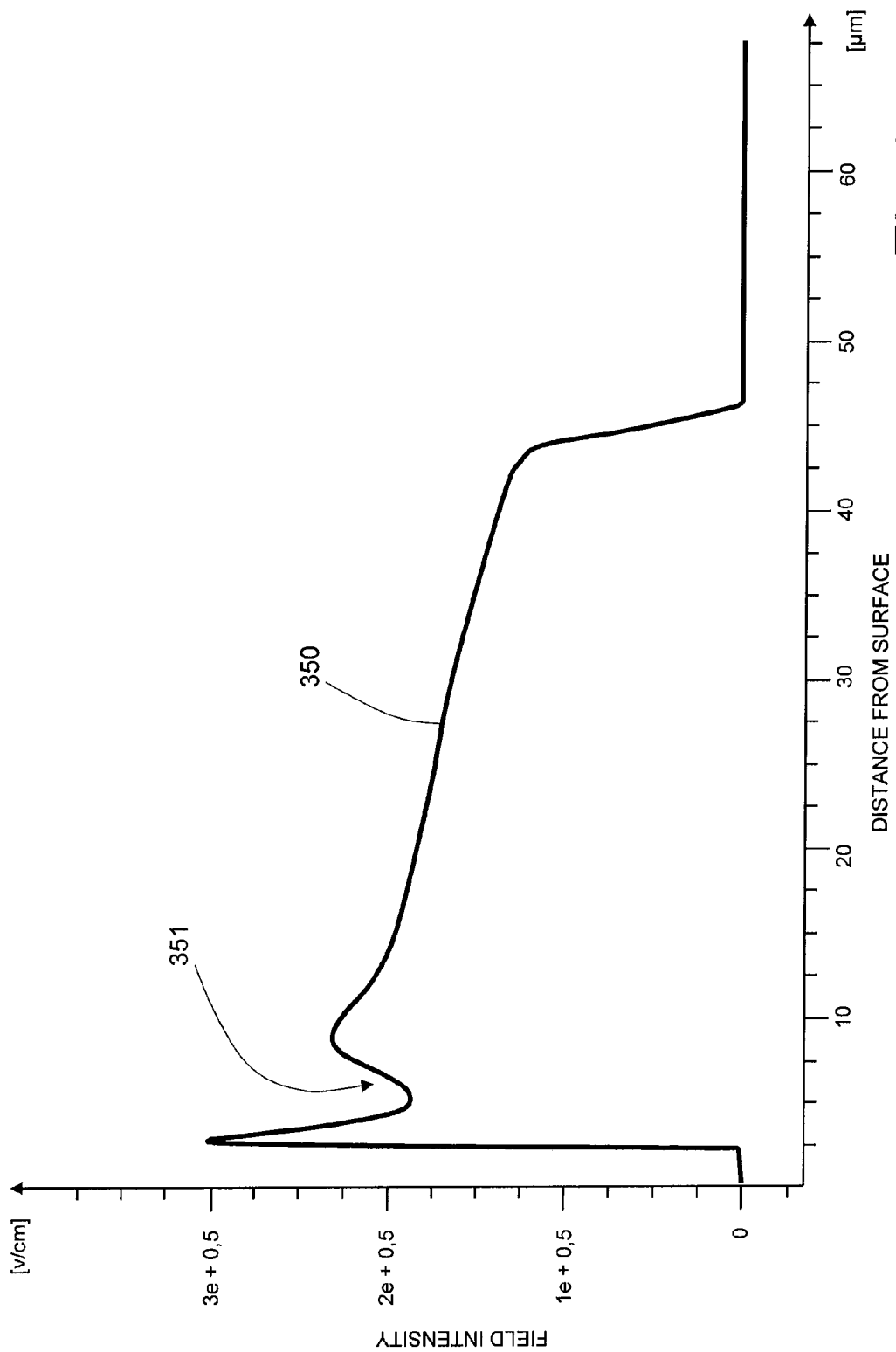
FIG. 14 is a curve of intensity of electrical field as the distance from the surface of an IGBT varies, according to the present disclosure.

The present applicant has found that, in presence of the buried region 44, the electrical field that is generated, during use, in the IGBT device 30 has a profile different from that of the field generated in an IGBT device that is similar but without the buried region 44. In greater detail, the present applicant has found that the electrical field undergoes a variation of the slope at the buried region 44, the consequence of which is an increase of the breakdown voltage when the IGBT device is reversely biased. The IGBT device 30 hence has a breakdown voltage higher than IGBT devices of a known type. FIG. 14 (illustrated hereinafter) shows, by way of example, the profile of the electrical field in the IGBT device 30 between the emitter terminal and the collector terminal (along the line of cross section I-I of FIG. 2).

Figure 3:
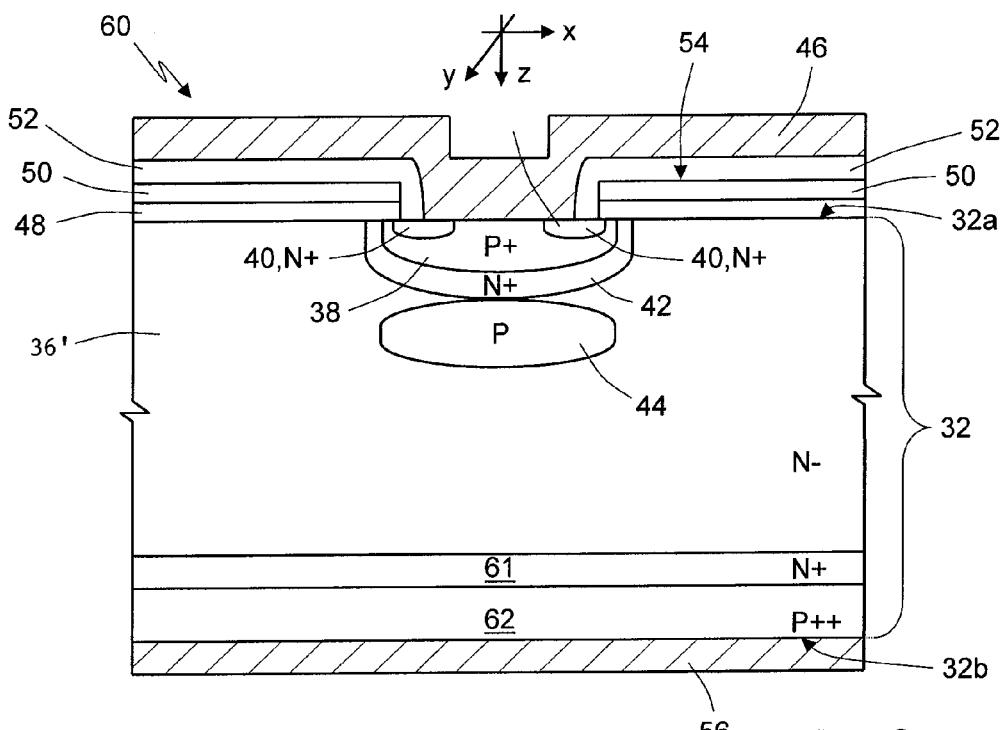
FIG. 3 shows, in cross-sectional view, an IGBT of a planar type according to a further embodiment of the present disclosure.

FIG. 3 shows an IGBT device 60 according to an embodiment alternative to the one illustrated in FIG. 2 (however, elements that are in common are designated by the same reference numbers and not described any further). In particular, the embodiment of the IGBT device of FIG. 3 differs from the one illustrated in FIG. 2 in that the substrate 32 is of an N− type, and in that the body region 38, the source region 40, and the barrier region 42 extend in depth in a drift region 36' of the substrate 32 and face the front side 32a of the substrate 32. The drift region 36' of FIG. 3, unlike the epitaxial drift layer 36 of FIG. 2, is simply a portion of the substrate 32, itself. Likewise, also the buried region 44 is formed in the drift region 36' of the substrate 32, in an area corresponding to and, in lateral sectional view, underneath the body region 38 (the body region 38 and the buried region 44 are at least partially aligned to one another along the axis Z, and the buried region 44 extends to a depth, along the axis Z, greater than the maximum depth of the body region 38). The buried region 44 is in direct contact with the barrier region 42. The IGBT device 60 is then completed to form a first implanted region 61, of an N+ type, obtained by implantation of dopant species from the back side 32b of the substrate 32, to a depth of approximately 1.5 µm (said implanted region 61 having the same function as the buffer layer 34 of FIG. 2), and to form a second implanted region 62, of a P++ type, by implantation of dopant species from the back side 32b of the substrate 32, said implanted region 62 extending facing the back side 32b between the surface of the back side 32b and the first implanted region 61.

The IGBT device 30 and the IGBT device 60 operate in a way similar to one another, and in particular share the same advantages deriving from the presence of the buried region 44.

FIGS. 4a-4f show steps of a manufacturing method that can be used for producing the IGBT device 30 of FIG. 2.

Figure 4A:
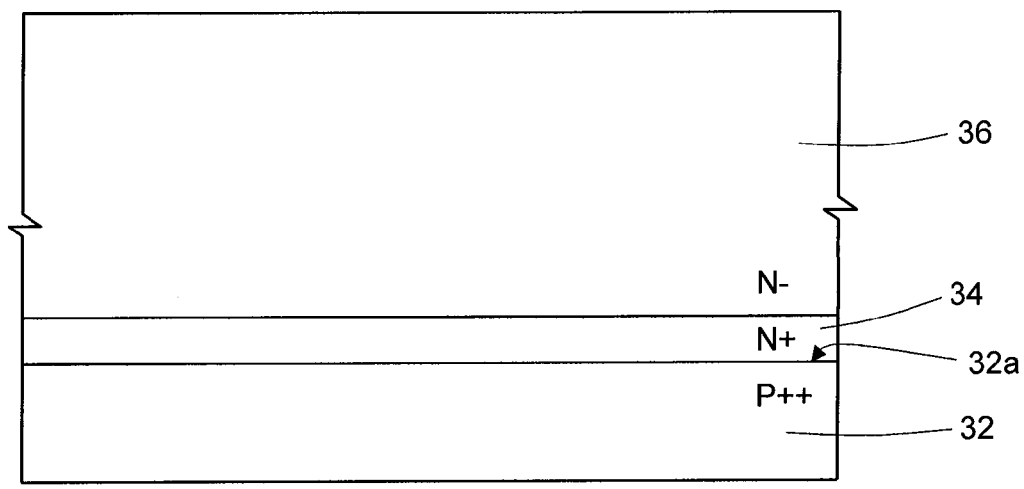
FIGS. 4a-4f show successive steps of a process of manufacture of the IGBT of FIG. 2.

With reference to FIG. 4a, the substrate 32, of a P++ doped type, of monocrystalline silicon is provided. Then, a first step of epitaxial growth is carried out on the front side 32a of the substrate 32. The epitaxial growth is performed in a controlled environment, for example with the chemical-vapor-deposition (CVD) technique, by depositing vapor of silicon and phosphorus, to form the buffer layer 34 (which, as has been said, is doped N+ with a concentration of between approximately $1 \cdot 10^{15}$ and $1 \cdot 10^{18}$ ions/cm$^3$). The buffer layer 34 has a thickness of between approximately 1 µm and 50 µm.

Next, a second step of epitaxial growth is carried out on the buffer layer 34, for example with the CVD technique, depositing vapors of silicon and phosphorus, to form a first intermediate drift layer 73 (which, as has been said, is doped N− with a concentration of between approximately $5 \cdot 10^{13}$ and $5 \cdot 10^{14}$ ions/cm$^3$). The first intermediate drift layer 73 has a thickness of between approximately 10 µm and 150 µm.

Then (FIG. 4b), a photoresist mask 70 is formed on the top side 73a of the first intermediate drift layer 73, and, by means of the photolithographic process, an opening 71 is defined in the region in which it is desired to form the buried region 44 of FIG. 2, exposing a portion of the top side 73a of the first intermediate drift layer 73. The opening 71 has a shape and width chosen according to the need, for example, in top plan view, a quadrangular shape with sides (opening of the photomask) of between approximately 0.5 µm and 5 µm.

Then a step of implantation of dopant species of a P type (for example, boron) is carried out (as represented schematically in FIG. 4b by the arrows 72) to form in the first intermediate drift layer 73 an implanted region 74. The implantation dose, according to one embodiment of the present disclosure, is between approximately $1 \cdot 10^{12}$ and $1 \cdot 10^{14}$ ions/cm$^2$, with an implantation energy of between approximately 80 keV and 1 MeV.

Then (FIG. 4c), the implantation step is followed by a step of epitaxial growth of silicon with N− doping on top of the first intermediate drift layer 73 to form a second intermediate drift layer 76 having a concentration of doping and a type of dopant approximately the same as the first intermediate drift layer 73. The second intermediate drift layer 76 has a thickness of between approximately 3 µm and 12 µm, preferably approximately 7 µm. The first drift layer 73 and the second drift layer 76 form the drift layer 36 of FIG. 2.

A step of surface enhancement is then carried out by implantation of dopant species of an N type on a surface portion of the second intermediate drift layer 76. Said step of surface enhancement comprises, for example, implanting phosphorus ions (with an implantation energy of between approximately 50 and 200 keV and a dose of between approximately $0.5 \cdot 10^{12}$ $0.5 \cdot 10^{13}$ ions/cm$^2$).

Next (FIG. 4d), a step of deposition of insulating material, for example silicon oxide (SiO$_2$), is carried out on the top side 36a of the drift layer 36 to form the first insulating layer 48. The first insulating layer 48 has, for example, a thickness of between approximately 30 nm and 1000 nm.

Then, a step of deposition of polysilicon is carried out on the first insulating layer 48 to form the intermediate gate layer 50, for example having a thickness of between approximately 100 nm and 1000 nm.

Next, formed on the intermediate gate layer 50 is a photoresist layer 79, and, by means of the photolithographic process, an opening 80 is defined in the photoresist layer 79 to expose a portion of the intermediate gate layer 50. The opening 80 is formed in the region of the drift layer 36 in which it is desired to form the body region 38, and is at least partially aligned to the implanted region 74. The opening 80 has, in top plan view, a for example quadrangular shape, with sides having the same length as one another or different lengths, for example of between approximately 1 µm and 10 µm. Any other shape for the opening 80 is, however, possible, according to the desired layout.

A step of etching of the intermediate gate layer 50 is then carried out, for example using nitric acid and hydrofluoric acid (HNO$_3$+HF), to expose the first insulating layer 48. This is followed by a step of etching of the first insulating layer 48, for example using hydrofluoric acid, to expose a corresponding surface portion of the drift layer 36.

Next, a step of implantation (represented schematically by the arrows 81) of dopant species of an N type, for example phosphorus, with a dose of between approximately $1 \cdot 10^{12}$ and $1 \cdot 10^{13}$ ions/cm$^2$ and with an energy of between 80 keV and 1 MeV, forms an implanted region 82 within the drift layer 36.

Figure 4B:
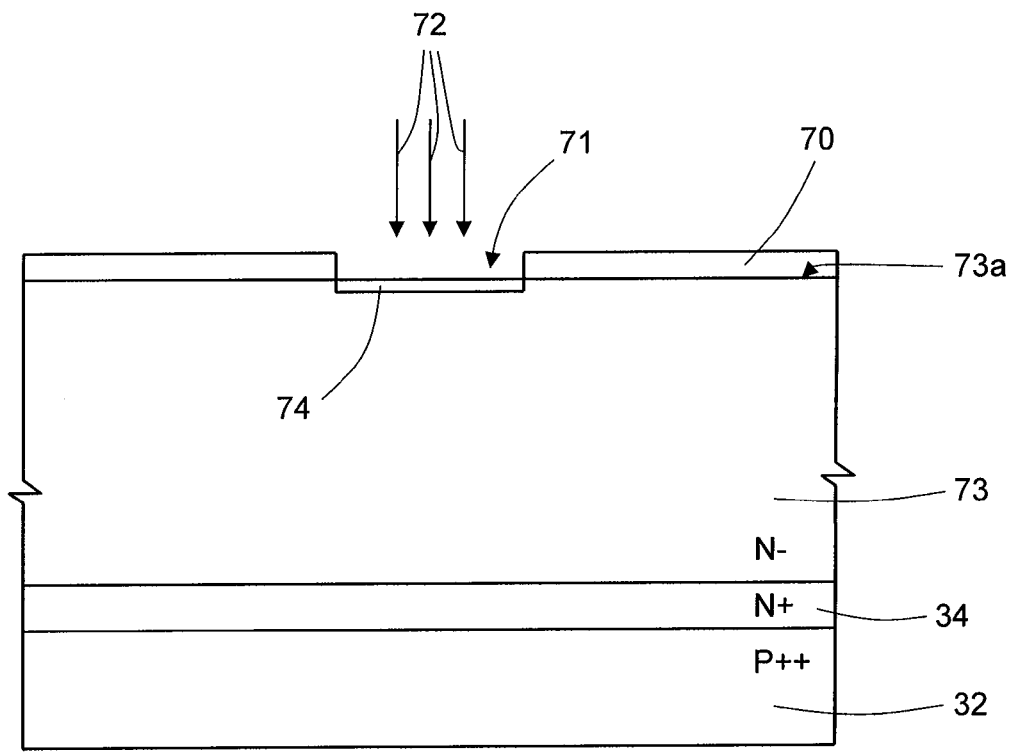
Figure 4C:
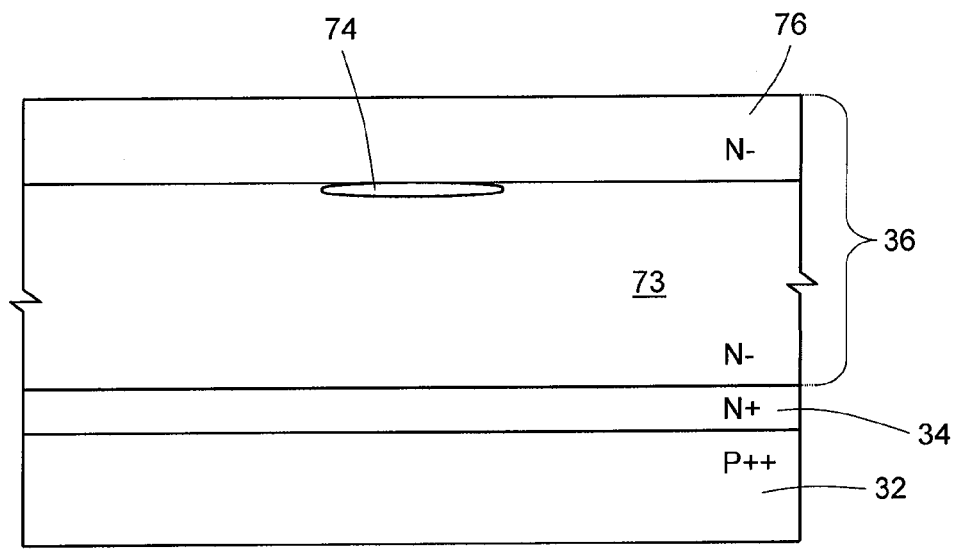
Figure 4D:
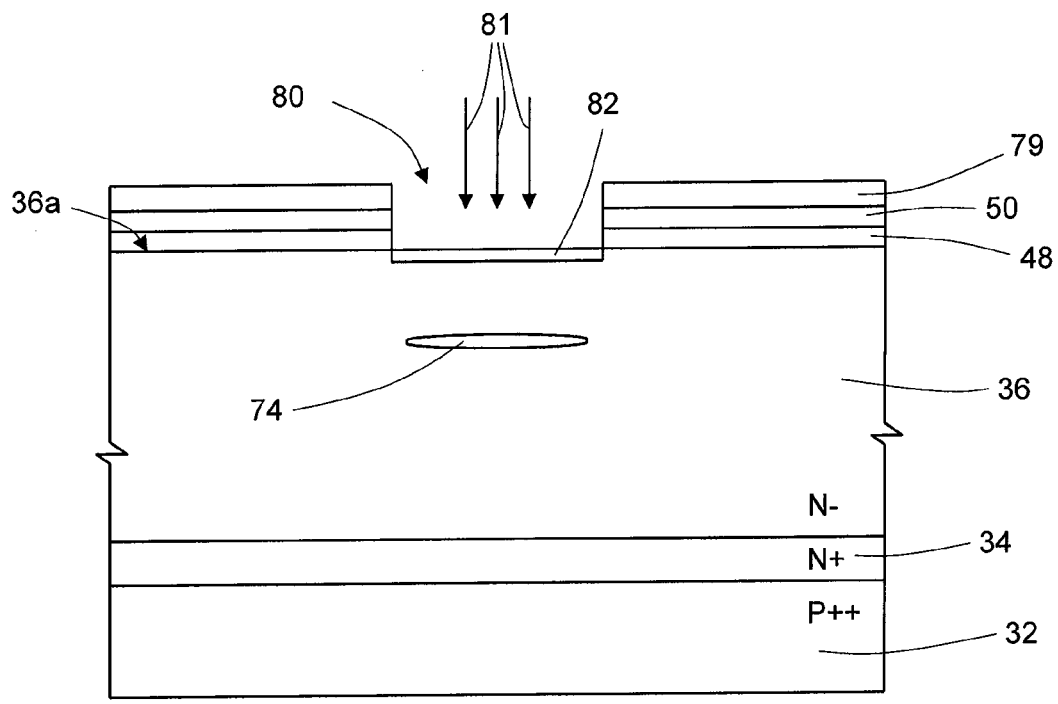
Figure 4E:
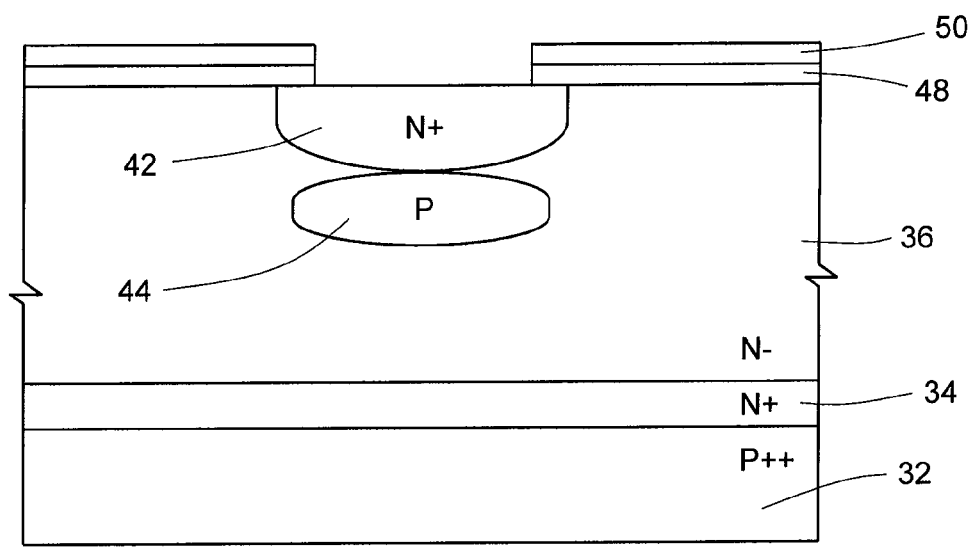

With reference to FIG. 4e, a step of thermal treatment is carried out so as to diffuse the implanted dopant species adequately (implanted regions 74 and 82). In this way, the buried region 44, with P doping, and the barrier region 42, with N+ doping, are formed.

Then (FIG. 4f), a new implantation is carried out (represented schematically by the arrows 83) of dopant species of a P type, for example boron, with a dose of between approximately $1 \cdot 10^{13}$ and $1 \cdot 10^{16}$ ions/cm$^2$ and an implantation energy of between approximately 50 keV and 200 keV at the opening 80 previously formed. A subsequent step of thermal diffusion leads to formation of the body region 38, of a P+ type.

An implantation of dopant species of an N type is then carried out within the body region 38, followed by a corresponding thermal process to favor diffusion thereof so as to form the source region 40.

This is followed by a step of deposition of a layer of borophosphosilicate glass (BPSG), which will become, following upon subsequent process steps, the second insulating layer 52. The layer of borophosphosilicate glass is deposited in a known way and selectively removed at the body region 38 to form an opening designed to enable subsequent electrical contact between the body region 38 and the contact-terminal layer 46. Next deposited on the second insulating layer 52 and in contact with the body layer 38 is a metal layer so as to form the contact-terminal layer 46.

Likewise, a metal-contact layer is deposited also on the back side 32b of the substrate 32 to obtain the IGBT device 30 of FIG. 2.

The IGBT device 60 of FIG. 3, and in particular the buried region 44, is formed in a way similar to what has been described with reference to FIGS. 4a-4f. However, in this case, the body region and the buried region 44 are formed, as has already been said, in the substrate. Consequently, the steps of epitaxial growth on the substrate are not necessary. Steps of implantation of dopant species from the back side 32b of the substrate 32 are, instead, envisaged to form the first and second implanted regions 61, 62.

The first implanted region 61 is formed, for example, by means of an implantation of phosphorus. The second implanted region 62 is formed, for example, by means of an implantation of boron.

Figure 5:
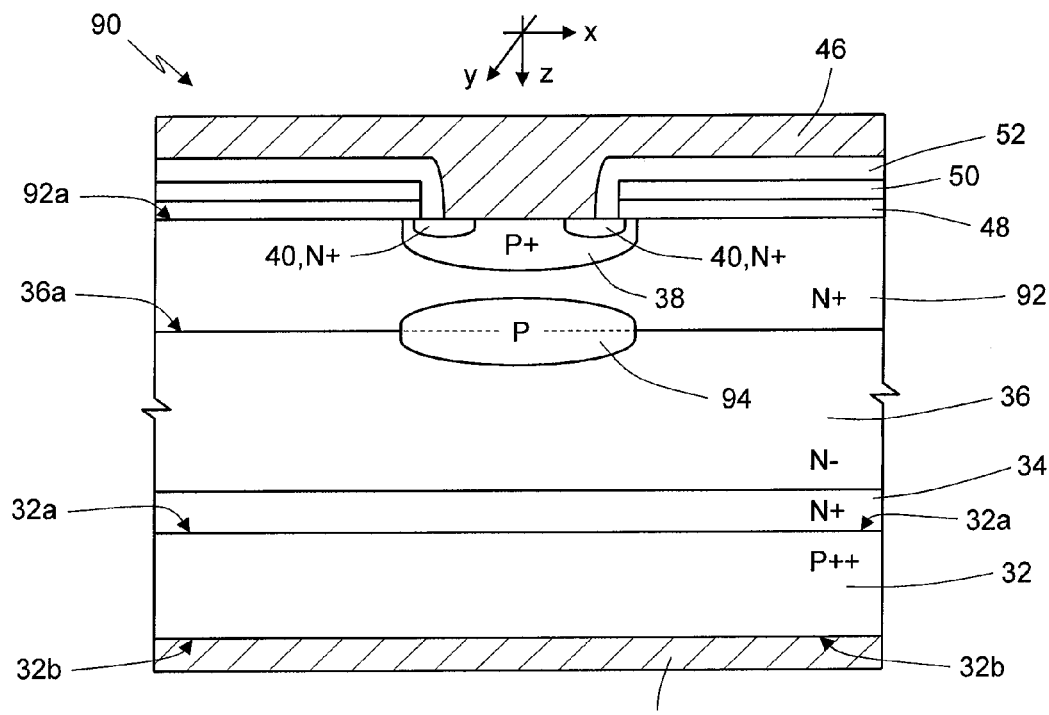
FIG. 5 shows, in cross-sectional view, an IGBT of a planar type according to a further embodiment of the present disclosure.

FIG. 5 shows an IGBT device 90 according to a further embodiment of the present disclosure. The IGBT device 90 of FIG. 5 is similar to the IGBT device 30 of FIG. 2. Elements that are in common between the IGBT device 90 of FIG. 5 and the IGBT device 30 of FIG. 2 are designated by the same reference numbers and will not be described any further.

The IGBT device 90 differs from the IGBT device 30 owing to the presence of a barrier layer 92, made of a semiconductor material (for example silicon) with an N doping, which extends on the top side 36a of the drift layer 36. According to one embodiment, the barrier layer 92 is made of silicon with N+ doping. The barrier layer 92 surrounds the body region 38 and separates the latter from the buried region 94 and has the same function as the barrier region 42 of the IGBT device 30 of FIG. 2.

The buried region 94 extends at the interface between the drift layer 36 and the barrier layer 92, in part in the drift layer 36 and in part in the barrier layer 92.

Figure 6:
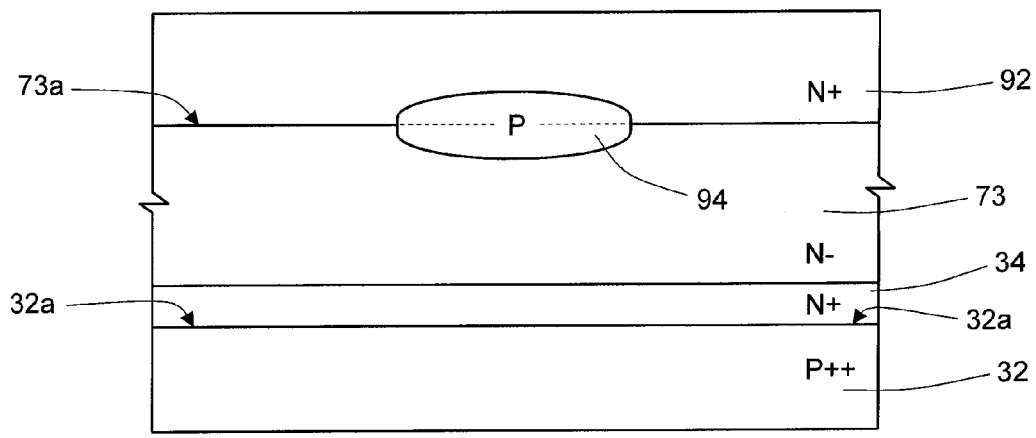
FIG. 6 shows the IGBT of FIG. 5 in an intermediate manufacturing step.

FIG. 6 shows an intermediate step of manufacture of the IGBT device 90 of FIG. 5. In particular, FIG. 6 shows the IGBT device 90 following upon manufacturing steps similar to those described with reference to FIGS. 4a and 4b, and to further steps described hereinafter.

According to FIG. 6, following upon implantation of dopant species of a P type to form the implanted region that will come to form (following upon the thermal process) the buried region 94, a step is carried out of epitaxial growth of semiconductor material (e.g., silicon) on the top side 73a of the first intermediate drift layer 73. In particular, the epitaxial growth is obtained by deposition of vapors of silicon and phosphorus ions, to form an epitaxial layer of silicon with a doping of an N type. The level of concentration of dopant in the barrier layer 92 thus formed is between approximately $1 \cdot 10^{15}$ and $1 \cdot 10^{16}$ ions/cm$^3$, to obtain a value of resistivity of the barrier layer 92 of between approximately 0.5 and 5 Ω·cm. The thickness of the barrier layer 92 is between approximately 3 μm and 12 μm. Structurally, the barrier layer 92 is similar to the second intermediate drift layer 76 described with reference to FIG. 4c.

The step of epitaxial growth (which is carried out typically at a temperature of approximately 1200° C.) is already sufficient to cause a partial diffusion of the implanted region 74.

Figure 4F:
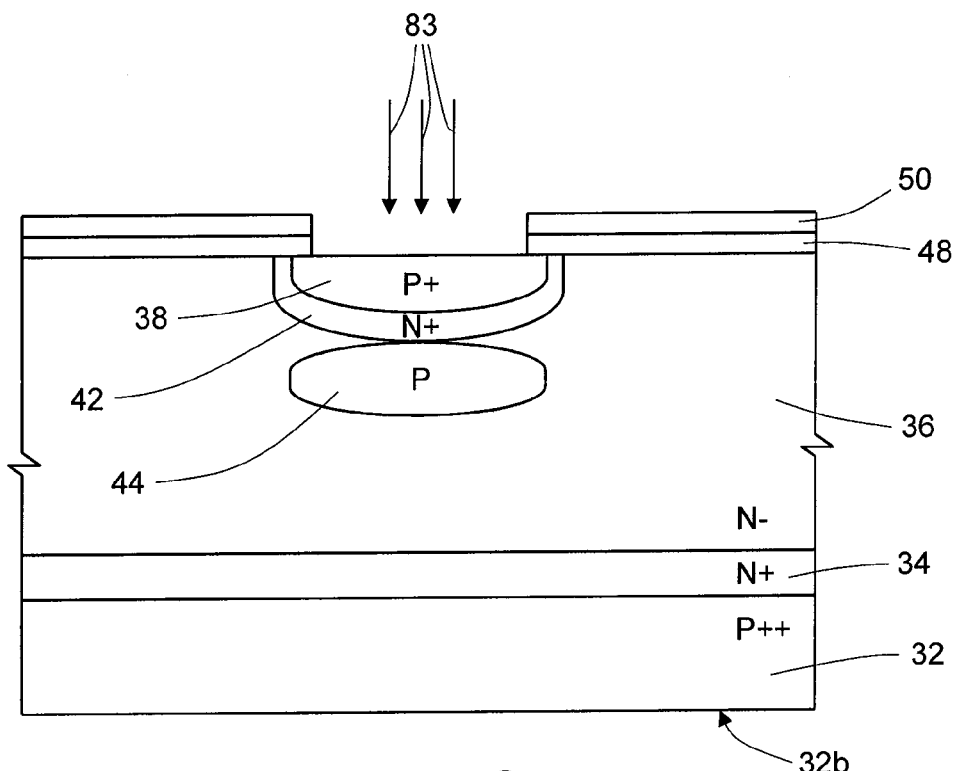

The steps described with reference to FIG. 6 are followed by completion of the production of the IGBT device 90 in a way similar to what has been described with reference to FIGS. 4d-4f. In this case, however, the implantation and diffusion of dopant species of an N type to form the barrier region 42 is obviously not necessary.

According to a further embodiment of the present disclosure (not shown in the figure), the IGBT device 90 of FIG. 5 can be alternatively formed according to what has been described with reference to the IGBT device 60 of FIG. 3. In particular, the body region 38 and the buried region 94 are formed in the substrate 32, and just one step of epitaxial growth is present, in particular to form the barrier layer 92 according to what has already been described. There are moreover envisaged steps of implantation of dopant species from the back side 32b of the substrate 32 to form appropriately doped implanted regions (an N+ region having the function of the buffer layer 34, and a P++ region facing the back side 32b of the substrate 32).

The present disclosure likewise applies to IGBT devices of a type with trench-gate terminal.

Figure 7:
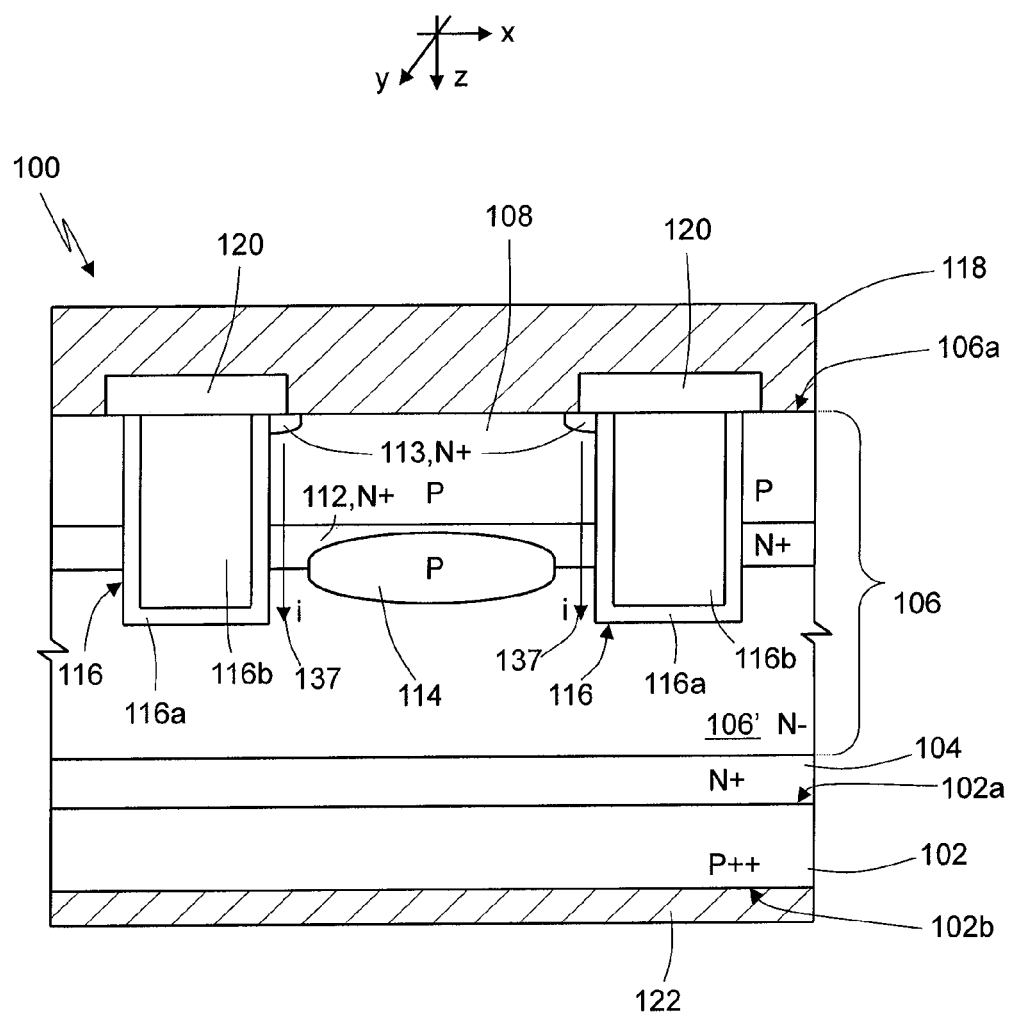
FIG. 7 shows, in cross-sectional view, an IGBT of a type with trench-gate terminal according to one embodiment of the present disclosure.

FIG. 7 shows an IGBT device 100 with trench-gate terminal, according to one embodiment of the present disclosure. The IGBT device 100 comprises a substrate 102, made of doped semiconductor material, for example of silicon with P++ doping having a value of resistivity ρ≤20 mΩ·cm. The substrate 102 has a front side 102a and a back side 102b. Extending on the front side 102a of the substrate 102 is a buffer layer 104 made of doped semiconductor material, for example silicon with N+ doping. The buffer layer 104 has a thickness of between approximately 1 μm and 50 μm, and a value of resistivity of between approximately 10 mΩ·cm and 1 Ω·cm. The buffer layer 104 is, for example, grown epitaxially on the substrate 102.

Extending on top of the buffer layer 104 is a structural layer 106 made of doped semiconductor material, for example silicon with N− doping. The structural layer 106 has a thickness of between approximately 10 μm and 150 μm, and a value of resistivity of between approximately 10 Ω·cm and 100 Ω·cm. The structural layer 106 is, for example, grown epitaxially on the buffer layer 104.

The structural layer 106 houses, on a top face 106a of its own, a body region 108, with P doping, which extends in depth in the structural layer 106 starting from the top face 106a. Extending underneath the body region 108 and in contact therewith is a barrier region 112 with N+ doping. The barrier region 112 separates the body region 108 from the rest of the structural layer 106, which assumes the function of drift region 106'.

Moreover present are source regions 113, with N+ doping, which extend into the structural layer 106 within the body region 108 and facing the top face 106a of the structural layer 106.

The IGBT device 100 further comprises gate regions 116 formed in respective trenches, which extend in the structural layer 106 from the top face 106a to the substrate 102. Each trench housing a gate region 116 has a depth greater than the thickness of the body region 108 and of the barrier region 112, and in any case smaller than the thickness of the structural layer 106.

Each gate region 116 comprises an insulating portion 116a and a conductive portion 116b, arranged with respect to one another in such a way that the conductive portion 116b is insulated from the structural layer 106 by means of the insulating portion 116a.

According to the present disclosure, the IGBT device 100 further comprises a buried region 114 with a doping of a P type, which extends within the structural layer 106 in electrical contact with the barrier region 112.

In line with what has been said with reference to the embodiment of FIG. 2, the distance between the body region 108 and the buried region 114 is preferably between 1 μm and 5 μm.

The buried region 114 is arranged facing a side portion of a respective gate region 116, at least partially aligned, along the axis Z, to the body region 108 set in a position corresponding to the same side portion of the respective gate region 116.

In the case illustrated in FIG. 7, where two gate regions 116 are present set facing one another, the buried region 114 is set between the two gate regions 116 facing one another. For the purposes of the present disclosure, the extension in depth into the structural layer 106 of the gate regions 116 and of the buried region 114 is such that the extension in depth of the gate regions 116 is equal to or greater than the extension in depth of the buried region 114. In other words, the maximum depth reached by the buried region 114 in the structural layer 106, in the positive direction of the axis Z, is equal to or less than the maximum depth reached by the gate region 116 in the structural layer 106 in the positive direction of the axis Z. In the case where the depth of the trench that defines the gate region 116 were to be less than the maximum depth reached by the buried region 114, it could happen that part of the electrons that come from the channel region recombine in the buried region 114, deteriorating the collector-emitter saturation voltage ($V_{CEsat}$) of the IGBT device.

The IGBT device 100 further comprises a contact-terminal layer 118, made of conductive material, for example metal, which extends over the top face 106a of the structural layer 106, in direct contact with the body region 108 and, at least partially, with the source regions 113. The contact-terminal layer 118 has, in use, the function of emitter contact of the IGBT device 100.

The contact-terminal layer 118 is moreover separated from the portions of the gate regions 116 that face the top side 106a of the structural layer 106 by respective insulation regions 120, for example made of borophosphosilicate glass (BPSG), each formed on top of a respective gate region 116.

Finally, extending on the back side 102b of the substrate 102, in direct electrical contact with the substrate 102, is a collector-terminal layer 122 made of conductive material, for example metal.

In use, the IGBT device 100 operates in a way similar to what has already been described with reference to the IGBT device 30 (with the evident differences due to the trench-gate terminal). The path of the current between the emitter terminal 118 and the collector terminal 122 is represented graphically by the arrows 137 and is substantially parallel to the direction defined by the axis Z (i.e., substantially orthogonal to the top face 106a of the structural layer 106 and to the back side 102b of the substrate 102).

With reference to FIGS. 8a-8f, a method for manufacturing the IGBT device 100 of FIG. 7 is described, according to one embodiment of the present disclosure.

Figure 8A:
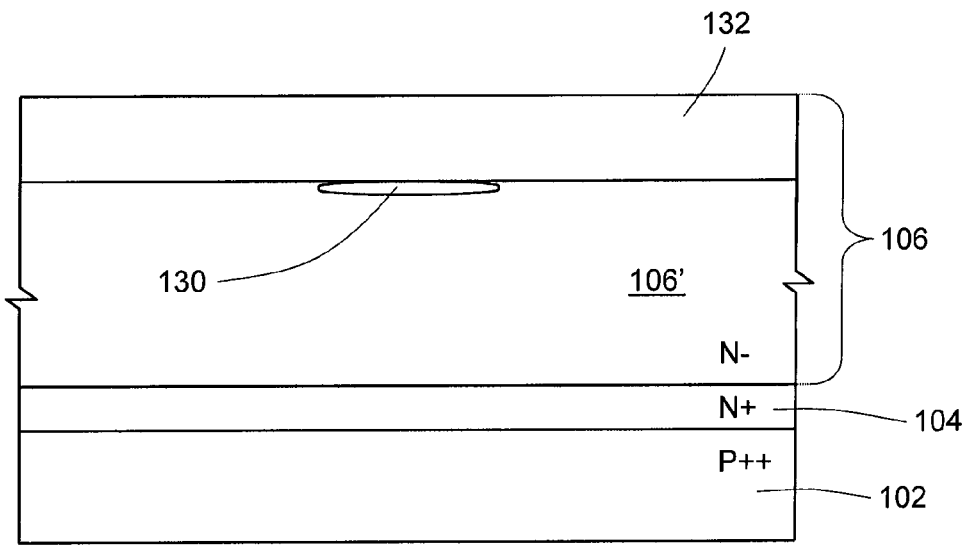
FIGS. 8a-8f show successive steps of a process of manufacture of the IGBT of FIG. 7.
Figure 8B:
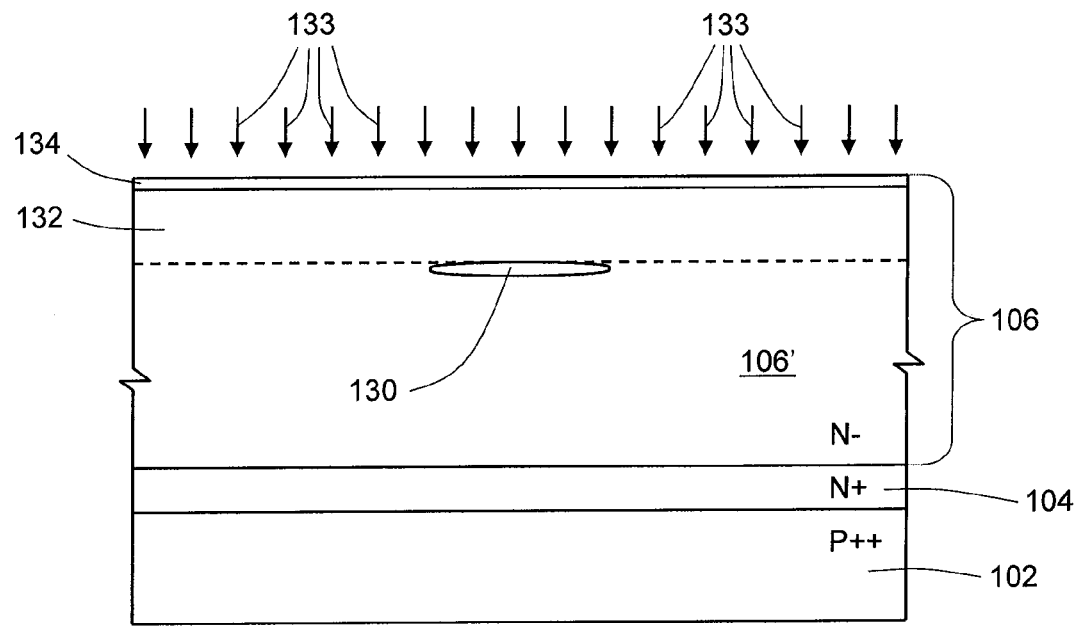
Figure 8C:
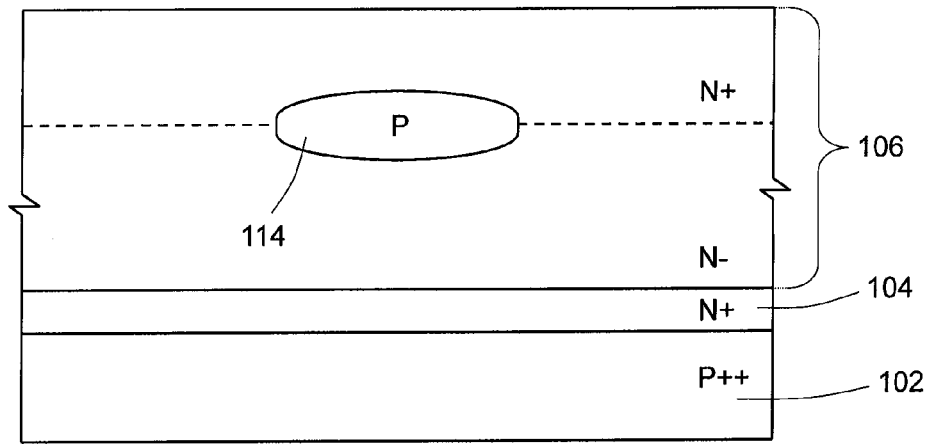
Figure 8D:
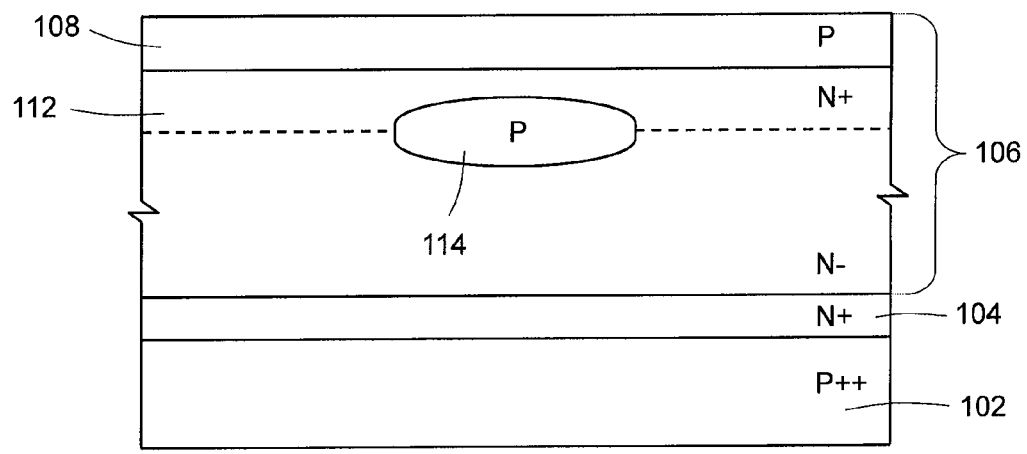

The steps of the method described with reference to FIG. 8a are similar to those described with reference to FIGS. 4a-4c and can vary for details such as doses of doping and/or thickness of the layers.

In the first place (FIG. 8a), the substrate 102 with a P++ doping is provided, made of monocrystalline silicon. Then, a first step of epitaxial growth is carried out on the front side 102a of the substrate 102. The epitaxial growth is performed in a controlled environment, for example using the chemical-vapor-deposition (CVD) technique, depositing vapors of silicon and phosphorus to form the buffer layer 104 (which, as has been mentioned previously, is doped N+ with a concentration of between approximately $1\cdot10^{15}$ and $1\cdot10^{18}$ ions/cm$^3$). The buffer layer 104 has a thickness of between approximately 1 µm and 50 µm.

Next, a second step of epitaxial growth is carried out on the buffer layer 104, for example with the CVD technique, depositing vapors of silicon and phosphorus to form the drift region 106' (which is doped N− with a concentration of between approximately $5\cdot10^{13}$ and $5\cdot10^{14}$ ions/cm$^3$). The drift region 106' has a thickness of between approximately 10 µm and 150 µm.

Then, a photoresist mask 127 is formed on the top side of the intermediate drift region 106' and, using the photolithographic process, an opening is defined in the region where it is desired to form the buried region 114 of FIG. 7, exposing a portion of the top side of the drift region 106'. Said opening has a shape and a width chosen according to the need, for example having in top plan view a quadrangular shape with a width of the photomask of between approximately 0.5 µm and 5 µm. Other shapes and other dimensions are, however, possible, according to the specific design requirements.

A step of implantation of dopant species of a P type (for example, boron) is then carried out to form an implanted region 130 in the drift region 106'. The implantation dose is, according to one embodiment of the present disclosure, between approximately $1\cdot10^{12}$ and $1\cdot10^{14}$ ions/cm$^2$, with an implantation energy of between approximately 80 keV and 1 MeV.

Then, the implantation step is followed by a step of epitaxial growth of silicon with N− doping or, alternatively, not doped, on the drift region 106', to form an intermediate structural layer 132. The intermediate structural layer 132 has a thickness of between approximately 3 µm and 12 µm. The drift region 106' and the intermediate structural layer 132 form the structural layer 106 of FIG. 7.

Then (FIG. 8b), an implantation (represented schematically by arrows 133) of dopant species of an N type (for example, phosphorus) is carried out in the structural layer 106, to form an implanted region 134. The implantation dose is between approximately $1\cdot10^{12}$ and $1\cdot10^{13}$ ions/cm$^2$, with an implantation energy of between approximately 80 keV and 1 MeV. The implantation of FIG. 8 is performed only in the active area of the device, using an appropriate mask. This approach is important in order to prevent doping of edge regions of the IGBT device 100, outside the active area.

A thermal process is then carried out (FIG. 8c) to favor diffusion of the dopant species of the implanted regions 130 and 134. The diffusion of the dopant species of the implanted gate region 130 leads to formation of the buried region 114, whereas the diffusion of the dopant species of the implanted gate region 134 leads to formation of the barrier region 112.

Then (FIG. 8d), a further implantation of dopant species of a P type in the active area (in particular within the region N+ that has formed following upon diffusion of the dopant species of the implanted region 134), and a subsequent thermal treatment to enable diffusion of the dopant, form the body region 108. Implantation of the dopant species of a P type to form the body region 108 comprises an implantation dose of between $1\cdot10^{13}$ and $1\cdot10^{14}$ ions/cm$^2$ with an implantation energy of between 80 keV and 1 MeV.

The next step is formation of the IGBT device 100. In particular (FIG. 8e), the source regions 113 are formed within the body region 108 by implantation of dopant species of an N type and a subsequent thermal process of diffusion. The source regions 113 have, in top plan view, a shape that is, for example, circular or quadrangular (even though any other shape is possible) and is formed in such a way as to surround, in top plan view, a respective gate region 116.

Next, the drift layer 106 is selectively etched so as to form trenches 140, which extend from the top face 106a of the structural layer 106 to the substrate 102. The depth of the trenches 140 in the structural layer 106 is equal to or greater than the maximum depth at which the buried region 114 is found. Each trench 140 is formed, for example, by dry etching, for example using a reactive-ion-etching (RIE) technique or a deep-reactive-ion-etching (DRIE) technique.

A step of deposition of a layer of insulating material, for example silicon oxide grown thermally, is then carried out so as to form, adjacent to the inner walls and to the bottom of each trench 140, the respective insulating portion 116a.

This is followed by a step of deposition of polysilicon until each trench 140 is filled to form the respective conductive portion 116b in each trench 140. The IGBT device 100 is finally completed to form portions of BPSG on the conductive portions 116b so as to insulate them from outside, to form the contact-terminal layer 118, made of conductive material, for example by deposition of metal, and to form the collector-terminal layer 122 on the back side 102b of the substrate 102, for example by deposition of conductive material, such as metal. The IGBT device 100 of FIG. 7 is thus obtained.

According to a further embodiment of the present disclosure (not shown in the figure), the substrate 102 is of an N− type. The layer with N+ doping, which forms the buffer layer 104, and the layer with P++ doping set between the buffer layer 104 and the collector-terminal layer 122 are formed by implantation of dopant species (respectively N and P) from the back side 102b of the substrate 102. The other steps of the manufacturing method are in common with those described with reference to FIGS. 8a-8f.

Figure 9:
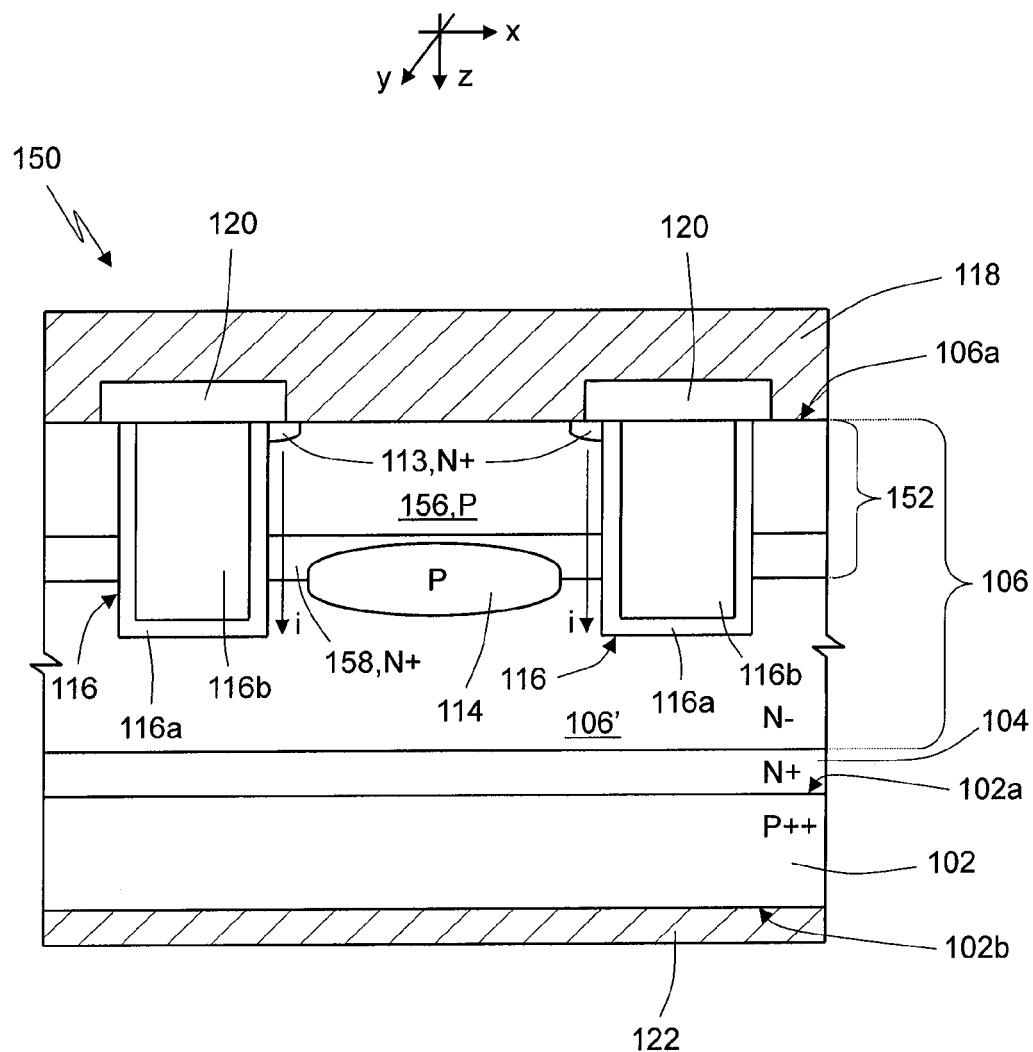
FIG. 9 shows, in cross-sectional view, an IGBT of a type with trench-gate terminal according to a further embodiment of the present disclosure.

FIG. 9 shows an IGBT device 150 according to a further embodiment of the present disclosure. In particular, the IGBT device 150 is of a trench-gate-terminal type. The IGBT device 150 of FIG. 9 differs from the IGBT device 100 of FIG. 7 in that the barrier layer (designated by the reference 112 in FIG. 7) is not formed by implantation but is a layer grown epitaxially and doped N+ during the step of epitaxial growth. The body region of the IGBT device is consequently formed in said epitaxial layer. The process of manufacture of the IGBT device 150 is described more fully with reference to FIGS. 10a and 10b. In the ensuing description, elements of the IGBT device 150 that are in common with those of the IGBT device 100 are designated by the same reference numbers and will not be described any further.

Figure 10A:
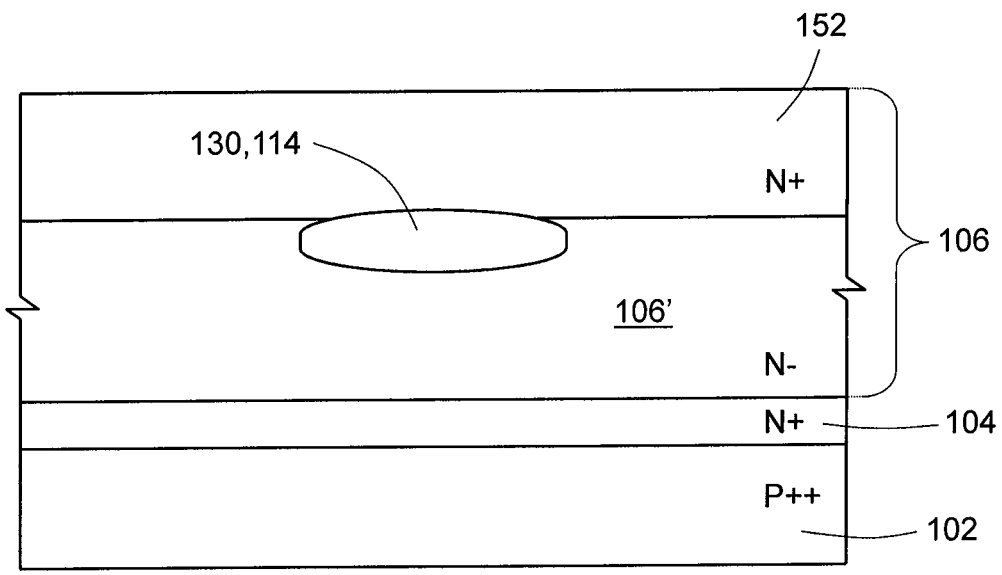
FIGS. 10a and 10b show intermediate steps of manufacture of the IGBT of FIG. 9.
Figure 10B:
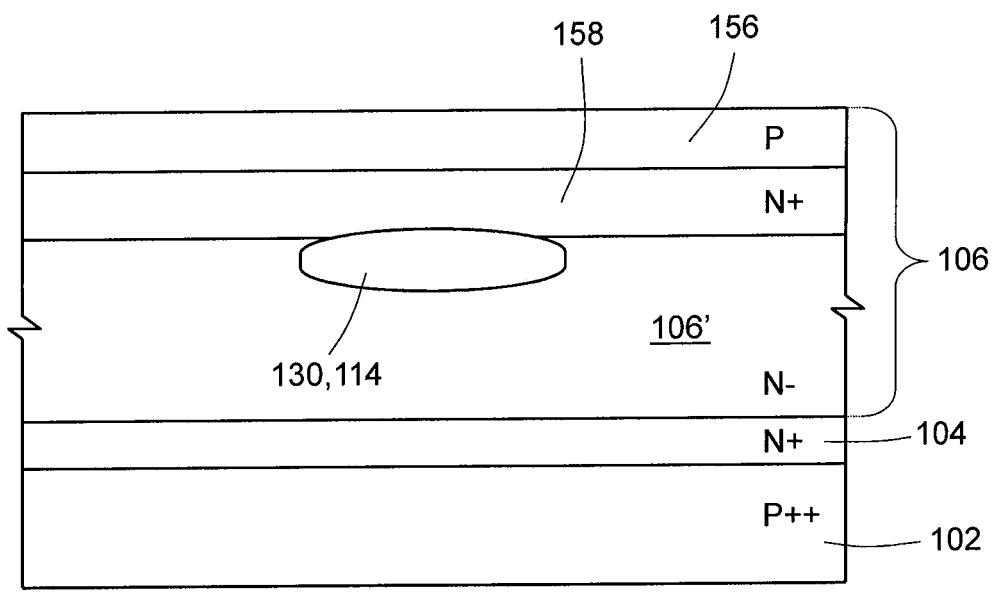

FIG. 10a shows the IGBT device 150 during an intermediate manufacturing step, and in particular following upon the manufacturing steps already described with reference to FIG. 8a and upon further steps described hereinafter.

In greater detail, the substrate 102 is provided, on which the buffer layer 104 and the drift region 106' are formed. Then, implantation of P dopant species is carried out to form the implanted region 130.

Next, an intermediate structural layer 152 is formed on the drift region 106'. The intermediate structural layer 152 differs from the intermediate structural layer 132 of FIG. 8a in that it has a doping of an N+ type. The intermediate structural layer 152 is formed, for example, by epitaxial growth of silicon in an environment with the presence of vapors of silicon and phosphorus, or other appropriate dopant species of an N type.

In greater detail, the intermediate structural layer of FIG. 10a has a doping level of between approximately $1 \cdot 10^{15}$ and $1 \cdot 10^{16}$ ions/cm$^3$, so as to obtain a value of resistivity of between approximately 0.5 and 5 Ω·cm. The thickness of the second intermediate drift layer 152 is between approximately 3 and 12 μm.

During the process of epitaxial growth of the intermediate structural layer 152, the implanted region 130 undergoes a partial diffusion.

Next (FIG. 10b), an implantation of dopant species of a P type is carried out in the active area of the IGBT device 150, and a subsequent thermal process for favoring diffusion thereof. The implantation step comprises implanting boron ions, with an implantation dose of between approximately $1 \cdot 10^{14}$ and $1 \cdot 10^{15}$ ions/cm$^2$ and an implantation energy of 80 keV–1 MeV.

In this way, a body region 156 (with P doping), and a barrier layer 158 (with N+ doping) are formed set between and in electrical contact with the body region 156 and the buried region 114.

Figure 8E:
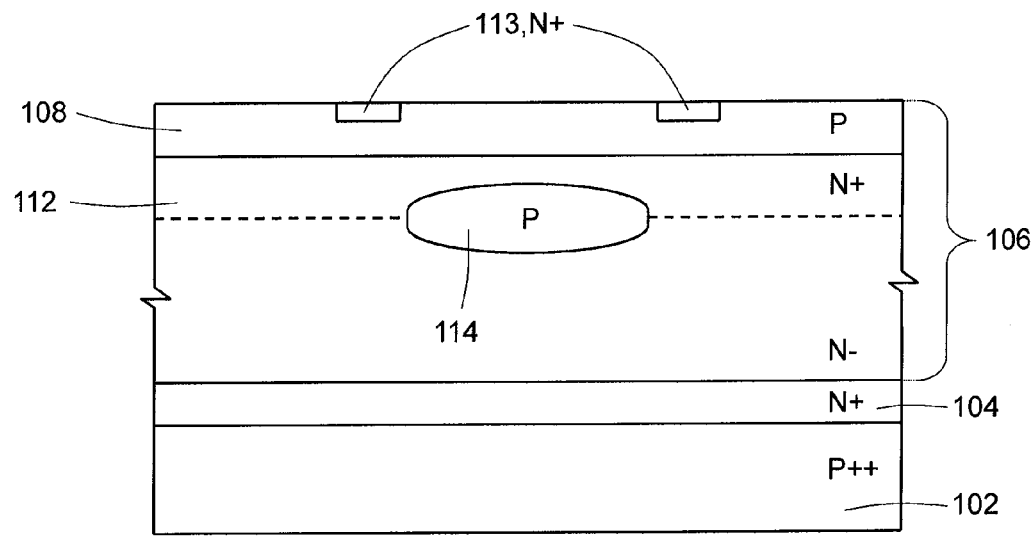
Figure 8F:
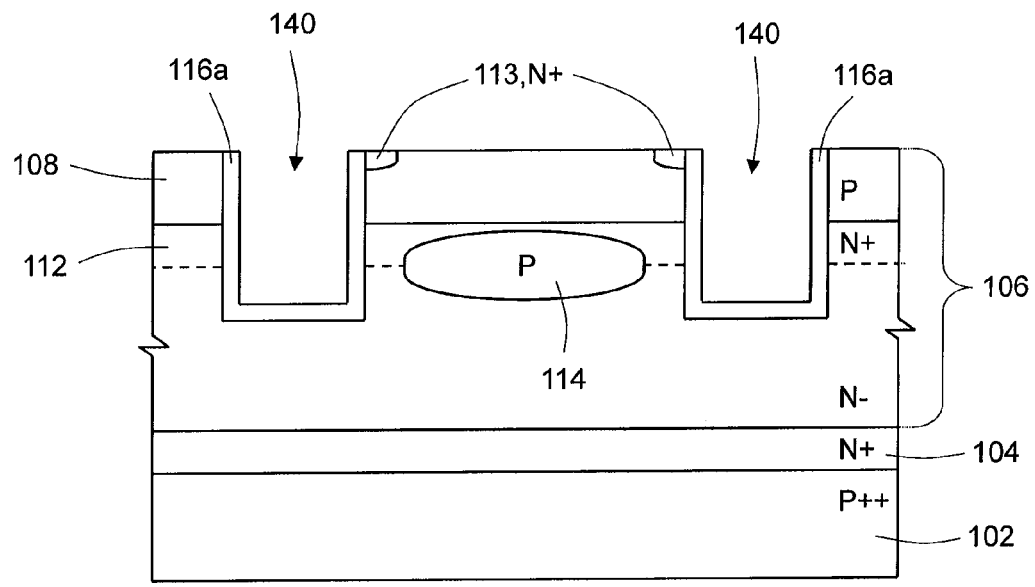

Next (not shown in the figure), the steps for formation of the gate trenches, the source regions and the emitter-contact terminal and the collector-contact terminal are carried out in a way similar to what has already been described with reference to FIGS. 8e and 8f.

The IGBT device 150 of FIG. 9 is thus formed.

In line with what has been has been described previously, according to a further embodiment of the present disclosure, the buffer layer 104 (with N+ doping) can be obtained by implantation of dopant species of an N type on the top side 102a of the substrate 102. Likewise, also the P++ doping of the substrate 102 can be obtained by implantation of dopant species of a P type. According to this embodiment, the starting substrate 102 has an N– doping.

It is evident that a plurality of IGBT devices 30, 60, 100, and 150 can be integrated in a single chip.

Figure 11:
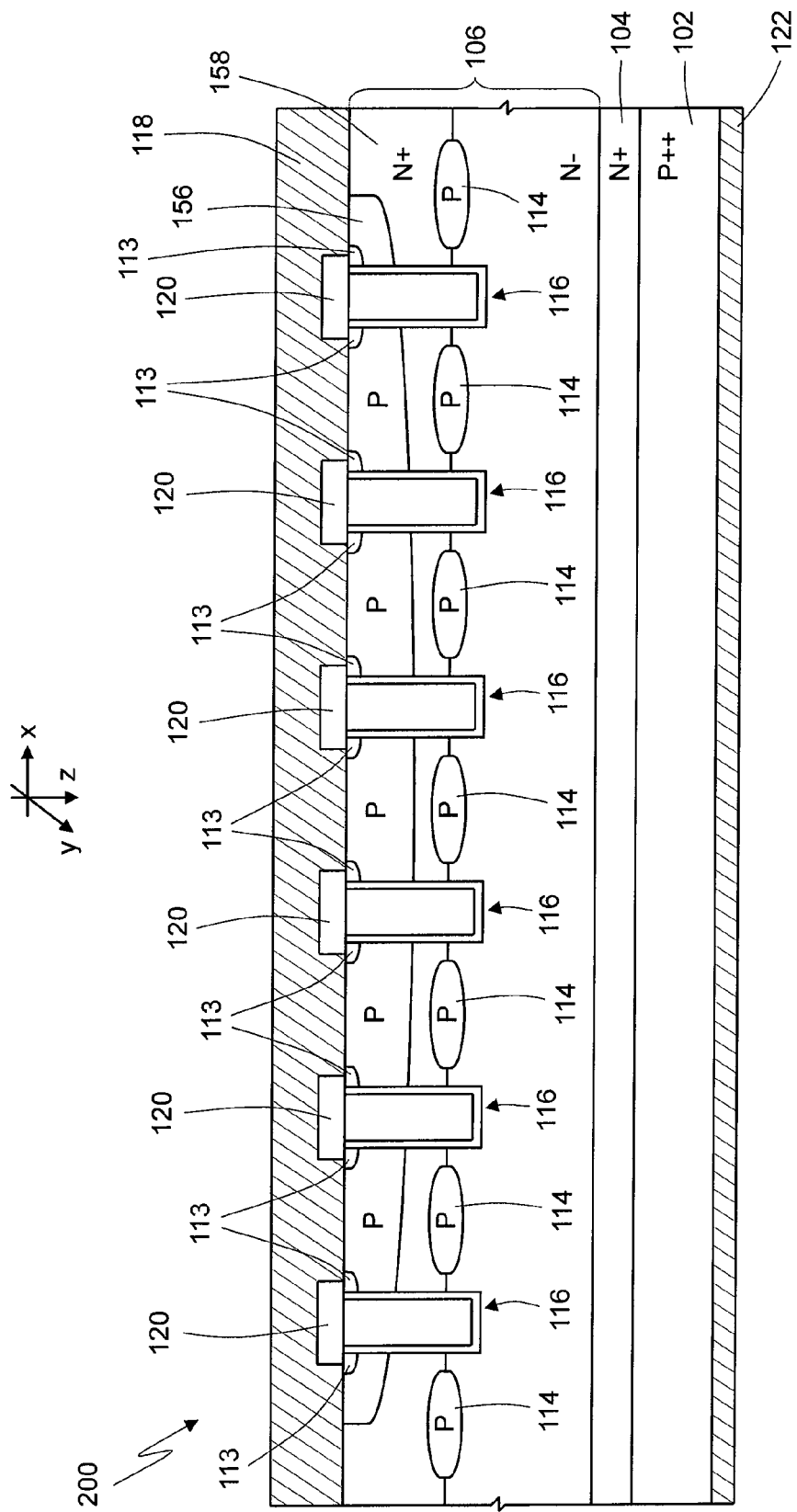
FIG. 11 shows, in cross-sectional view, a chip comprising a plurality of IGBT devices of FIG. 9.

For example, FIG. 11 shows a chip or die 200 comprising a plurality of IGBT devices 150. The chip 200 of FIG. 11 comprises a plurality of gate regions 116 and a respective plurality of source regions 113. Extending alongside each gate region 116 is a buried region 114 of the type described previously.

It is evident that the IGBT devices 150 of FIG. 11 can be replaced, in a way evident to the person skilled in the branch, by IGBT devices 30, 60, 90, or 100 according to any other of the embodiments described previously.

Figure 12:
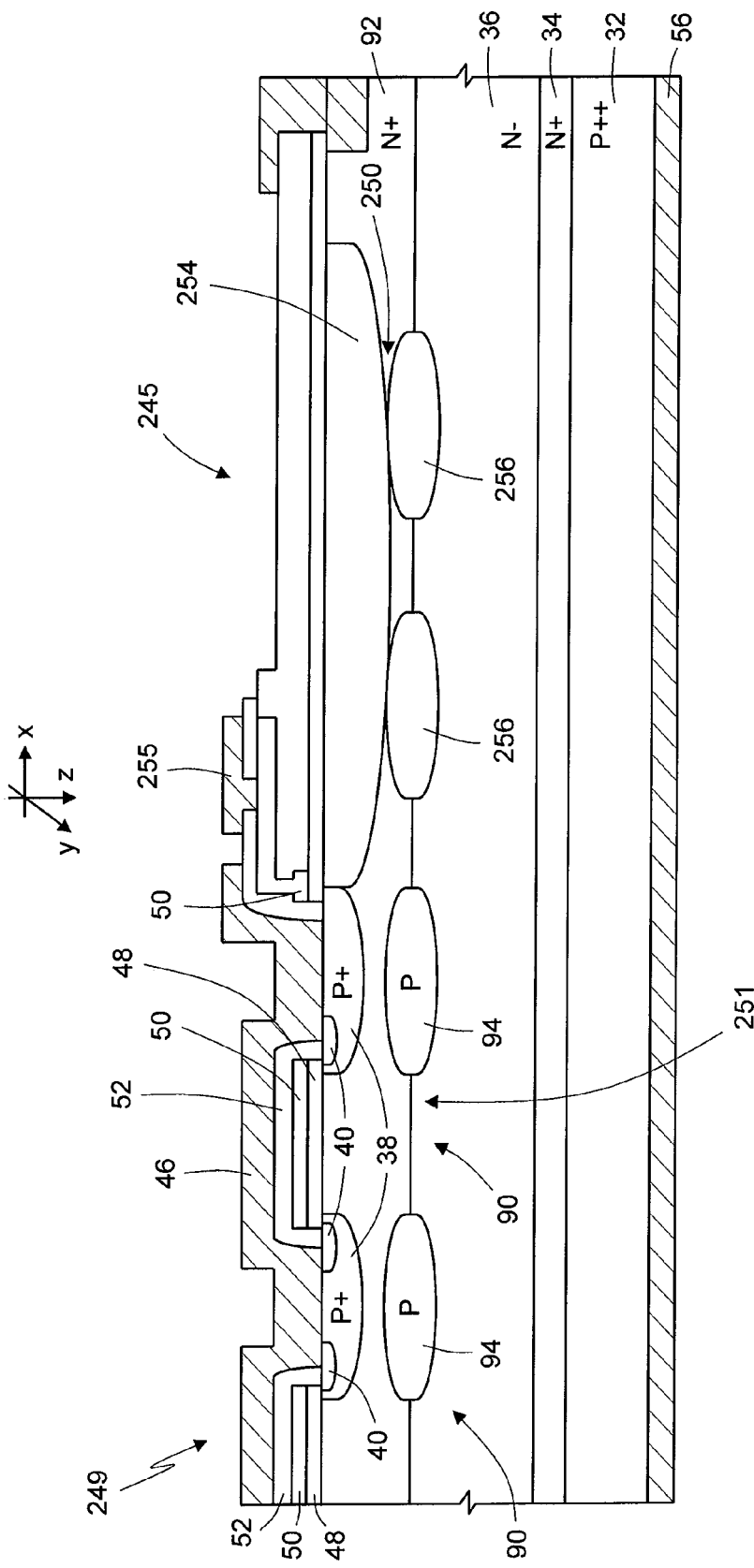
FIG. 12 shows, in cross-sectional view, an embodiment of an edge-termination structure of a chip comprising one or more IGBT devices formed according to the embodiment of FIG. 5.

If a plurality of IGBT devices 90 are integrated in a single chip, it is advisable to form an appropriate edge-termination region. FIG. 12 shows an edge region 245 of a chip 249 comprising one or more IGBT devices 90 according to the embodiment of FIG. 5 (elements that are in common are designated by the same reference numbers).

The edge region 245 is a region of the chip 249 outside the active area 251 of the IGBT devices 90, in which the body and source regions are formed. FIG. 12 shows, in the edge region 245, a gate-contact terminal 255 for biasing the gate terminals in a known way.

In particular, FIG. 12 shows an edge-termination structure used, in general, when the formation of the barrier layer with N+ doping (for example, the barrier layer 92 of FIG. 5) extends beyond the active area 251 of the IGBT device, creating an electrical connection between the active area 251 and regions outside the active area 251. This situation arises, for example, in the case of an IGBT device obtained according to the embodiment of FIG. 5 (i.e., the IGBT device is of a planar type and comprises a barrier layer 92 grown epitaxially). The edge structure described is not, however, limited to said embodiment.

The edge-termination structure 250 comprises, according to a first embodiment, an edge ring 254, which extends into the barrier layer 92 facing a top side 92a of the barrier layer 92. The edge ring 254 is formed by implantation of dopant species of a P type, for example simultaneously with formation of the body regions 38. Moreover present at the interface between the drift layer 36 and the barrier layer 92, in a position corresponding to the portion of the barrier layer 92 in which the edge ring 254 extends, is at least one implanted well 256 (two implanted wells 256 are illustrated in FIG. 12). The implanted wells 256 are similar to the buried region 94 and are for example formed simultaneously with formation of the buried regions 94. The implantation dose and energy for formation of the edge ring 254 are chosen in such a way that, during the step of diffusion of the implanted dopant species, the edge ring 254 and the implanted wells 256 extend into the barrier layer 92 until they come into contact with one another. In this way, a charge region P is formed inside the barrier layer 92, which interrupts the path of possible charge carriers of an N type that flow from the active area 251 to the edge of the chip 252.

Figure 13:
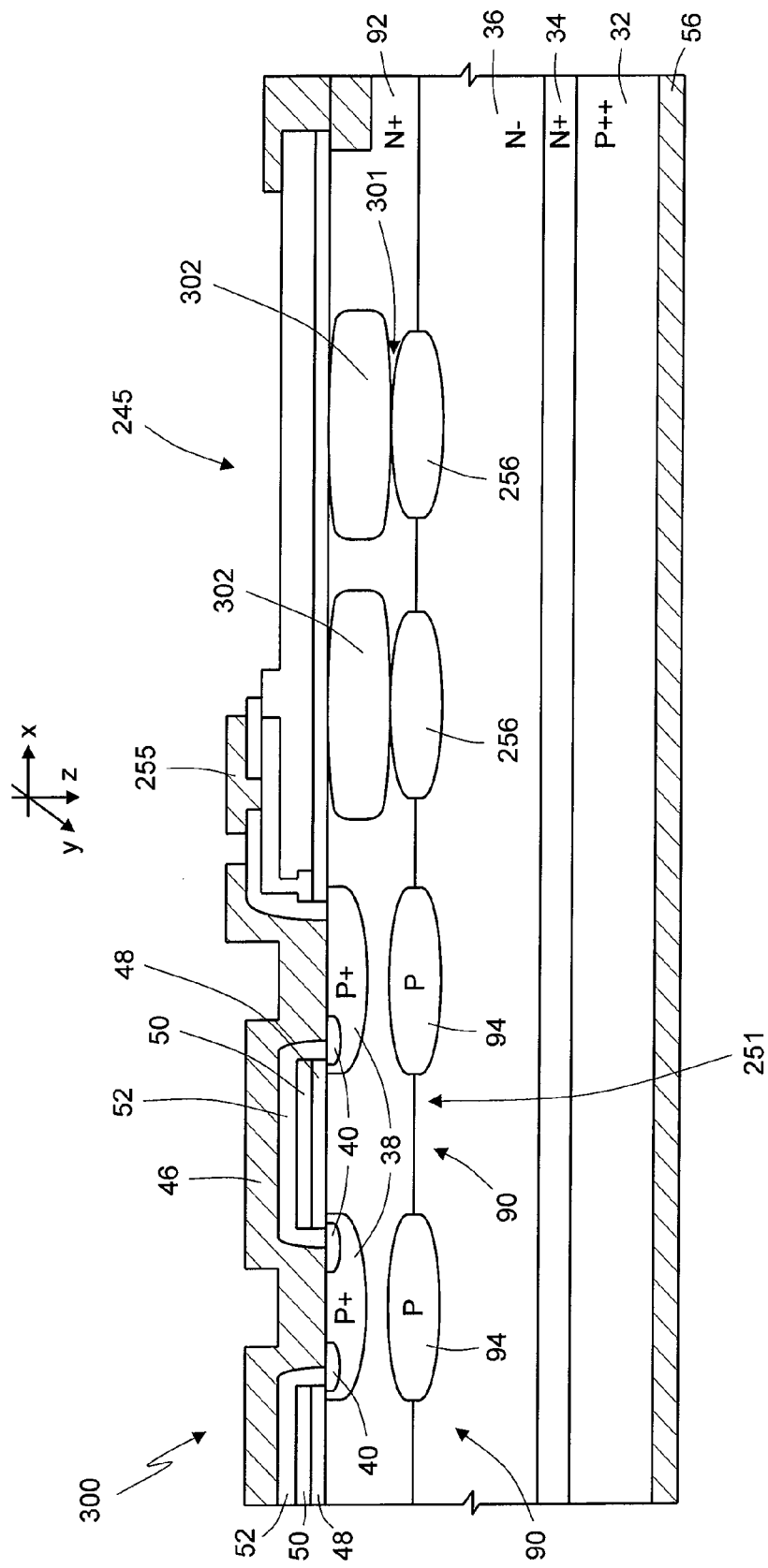
FIG. 13 shows a further embodiment of an edge-termination structure of a chip comprising one or more IGBT devices formed according to the embodiment of FIG. 5.

FIG. 13 shows an edge-termination structure 301 of a chip 300 comprising one or more IGBT devices 90, according to an embodiment alternative to what has been described with reference to FIG. 12 (however, elements that are in common with what is illustrated in FIG. 12 are designated by the same reference numbers). In this case, the edge ring 254 is replaced by a plurality of edge rings 302. In particular, each edge ring 302 has a spatial extension that is approximately the same as the spatial extension of the implanted wells 256. Furthermore, each edge ring 302 is formed in a position corresponding to and at least partially aligned (in top plan view) with a respective implanted well 256.

Each of the edge rings 302 is formed in a way similar to what has already been described with reference to the edge ring 254. In this way, during the step of diffusion of the implanted dopant species, the edge rings 302 and the implanted wells 256 come into contact with one another to form a respective plurality of charge regions P inside the barrier layer 92 that interrupt the path of possible charge carriers of an N type that flow from the active area 251 to the edge of the chip 300.

From an examination of the characteristics of the disclosure provided according to the present disclosure the advantages that it affords are evident.

As has been said, the present disclosure, irrespective of the particular embodiment of the IGBT device, makes it possible to obtain an increase in the breakdown voltage. The curve 350 of FIG. 14 shows the profile of the electrical field that is set up between the emitter terminal 46 and the collector terminal 56 within the active area of the IGBT device 30, from the top side 36a of the drift layer 36 (FIG. 2) to the substrate 32. The reversal of the slope of the curve (designated by the reference 351) corresponds to the depth at which the buried region 44 is located. It is evident that a similar curve can be obtained for all the IGBT devices described according to the embodiments of the present disclosure and not only for the IGBT device 30 of FIG. 2 (reference to which has been used herein merely for greater clarity of exposition).

The present disclosure also affords an advantage as regards the energy off of the IGBT device.

Figure 1A:
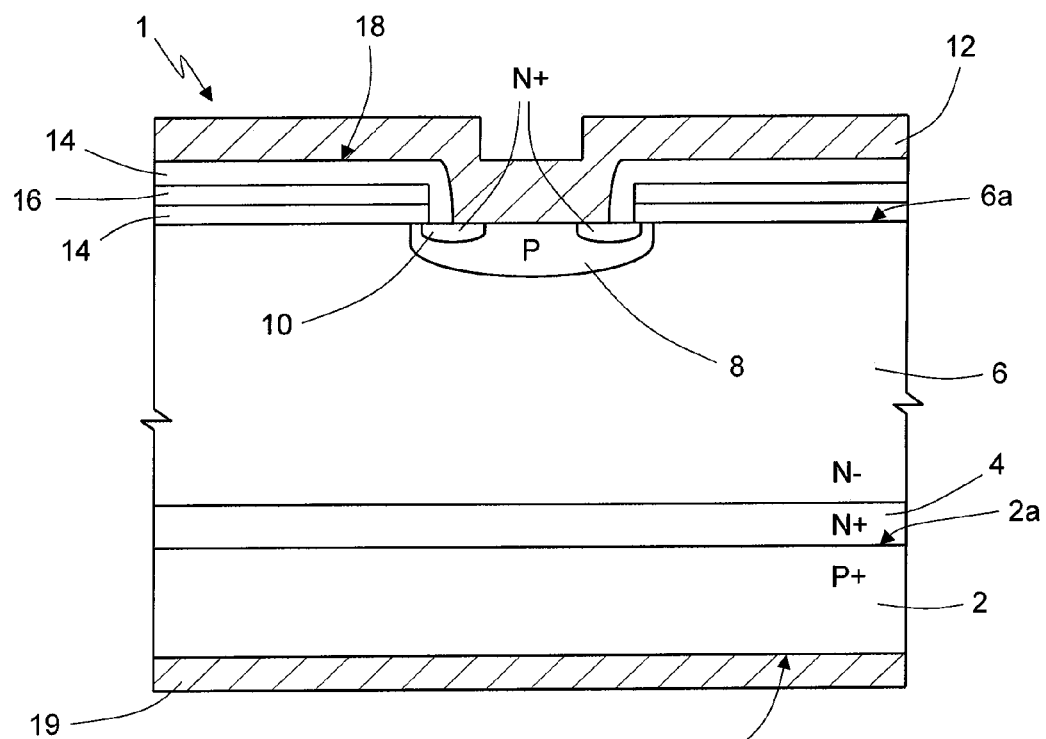
FIGS. 1a and 1b show respective IGBTs of a known type.
Figure 1B:
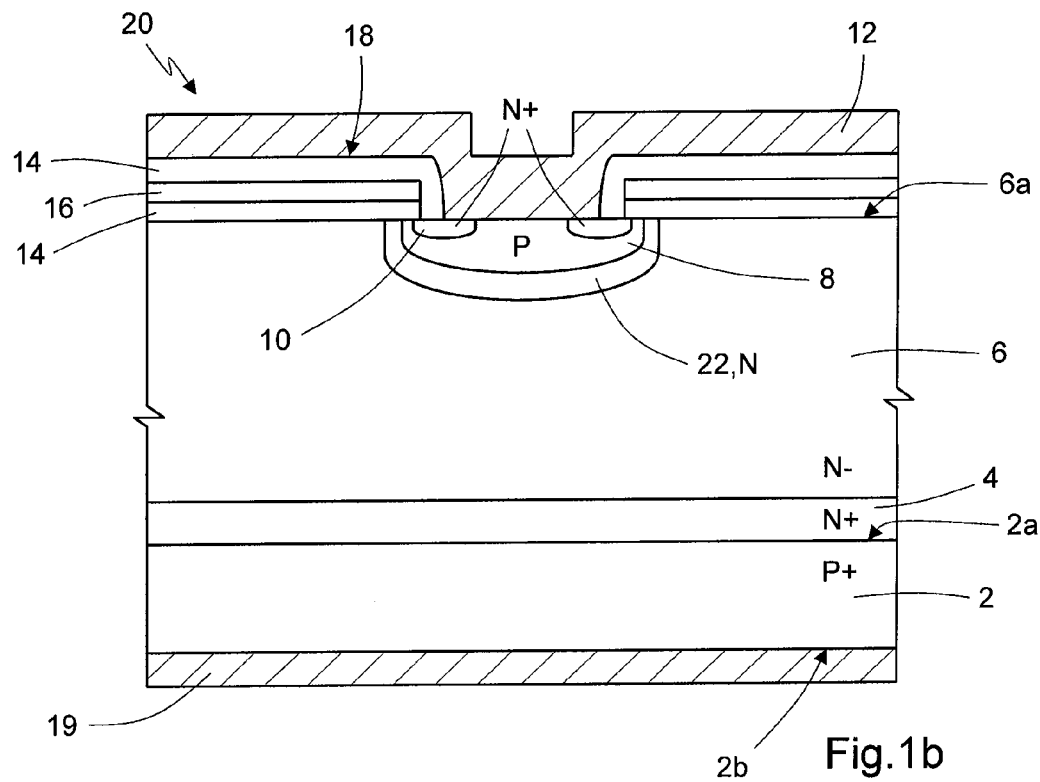
Figure 15:
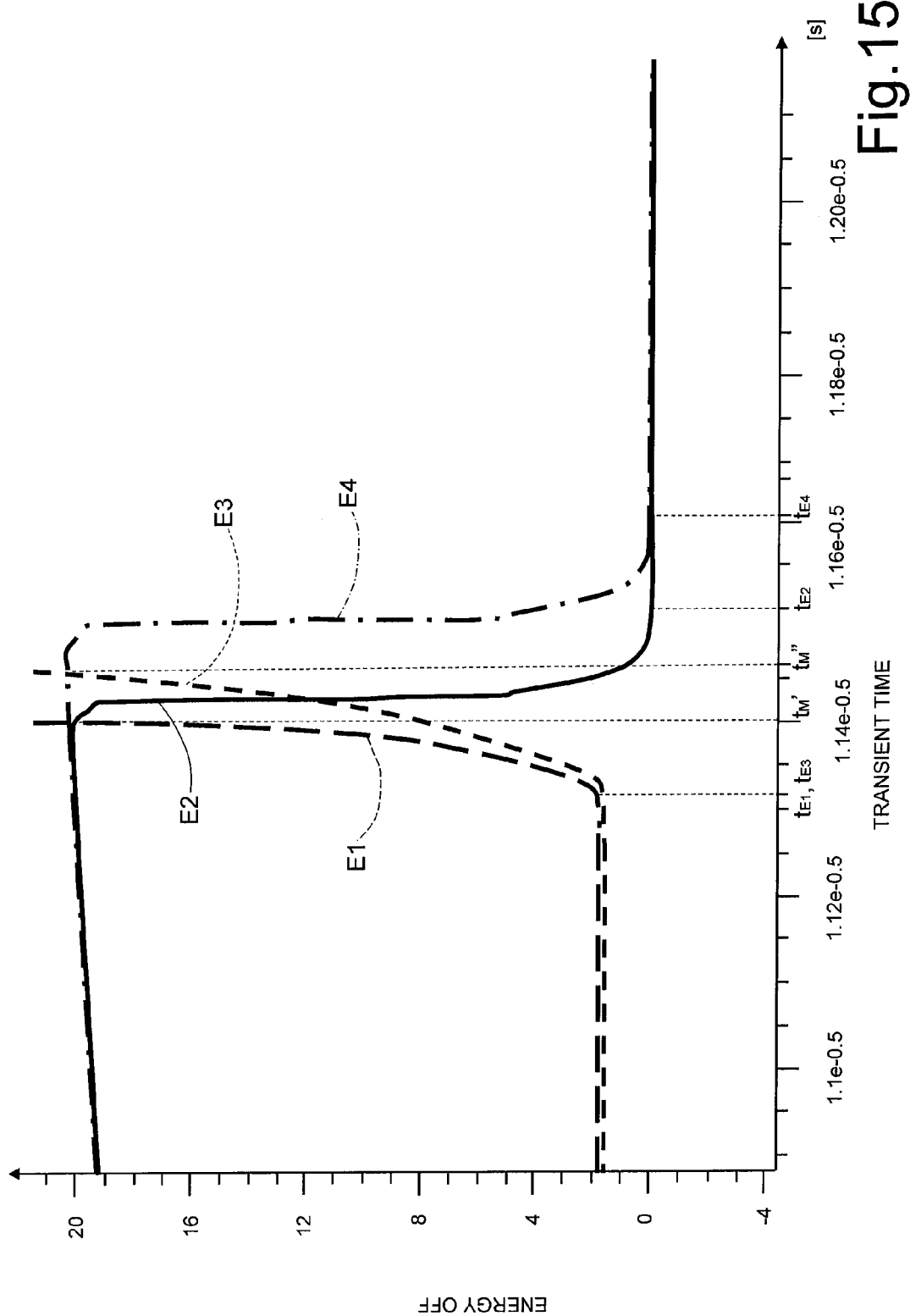
FIG. 15 shows energy-off curves of an IGBT device according to the present disclosure as compared to an IGBT device of a known type.

FIG. 15 shows switching-off curves E1 and E2 for an IGBT device according to the present disclosure (for example, the IGBT device 30 of FIG. 2) and switching-off curves E3 and E4 for an IGBT device of a known type, for example of the type shown in FIG. 1b.

As may be noted, the curve E1 rises more rapidly than the respective curve E3. Likewise, the curve E2 drops more rapidly than the respective curve E4. The curves E1 and E2 represent respectively the voltage $V_{CE}$ and the current Ic of the IGBT device 30 of FIG. 2, whereas the curves E3 and E4 represent respectively the voltage $V_{CE}$ and the current Ic of the IGBT device of FIG. 1b (of a known type). The area subtended by the curve E1 in the time interval $t_{E1}$-$t_{M'}$, added to the area subtended by the curve E2 in the time interval $t_{M'}$-$t_{E2}$ is smaller than the area subtended by the curve E3 in the time interval $t_{E3}$-$t_{M''}$ added to the area subtended by the curve E4 in the time interval $t_{M''}$-$t_{E4}$, which hence means lower energy dissipation for each individual switching.

The instant $t_{E1}$ is substantially the instant at which the curve E1 starts to rise, and corresponds approximately to the instant $t_{E3}$, at which also the curve E3 starts to rise. Instead, the instants $t_{E2}$ and $t_{E4}$ are, respectively, the instants at which the curves E2 and E4 reach a substantially stable value. The instant $t_{M'}$ is the instant of intersection between the curve E1 and the curve E2; the instant $t_{M''}$ is the instant of intersection between the curve E3 and the curve E4.

Finally, it is clear modifications and variations may be made to what has been described and illustrated herein, without thereby departing from the sphere of protection of the present disclosure.

Figure 16:
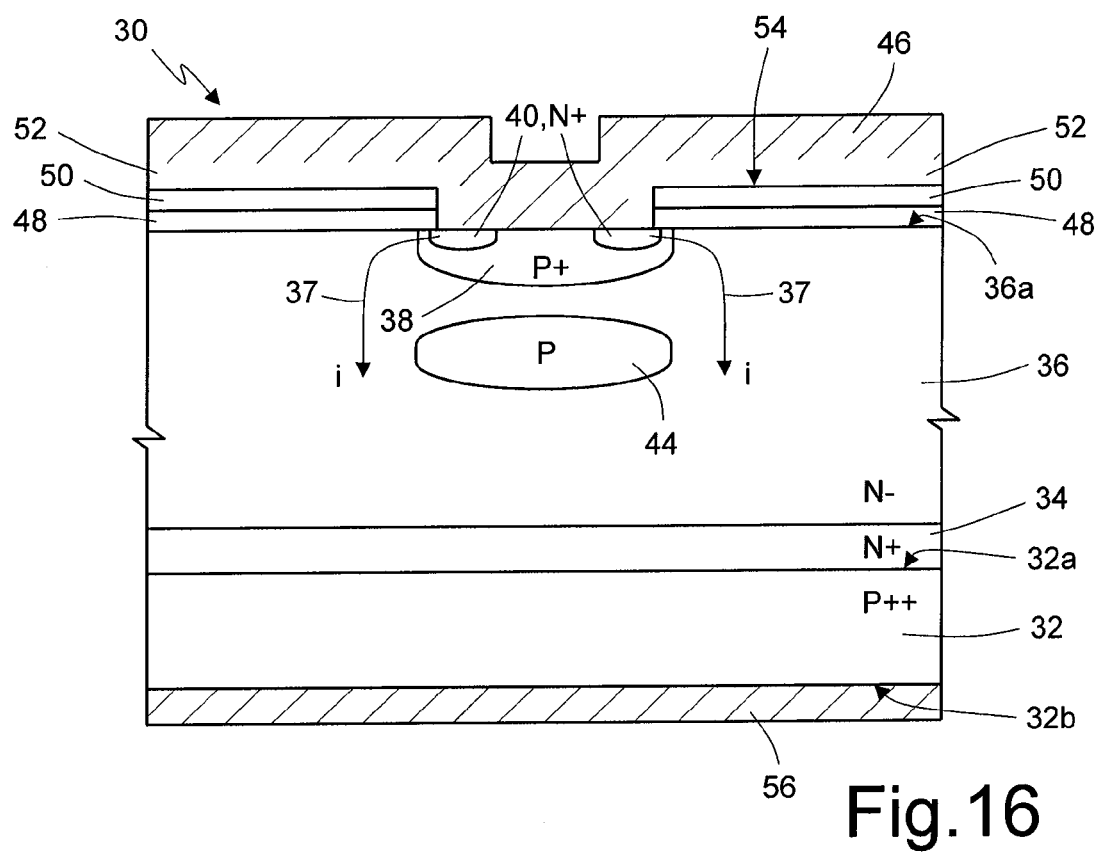
FIG. 16 shows, in cross-sectional view, an IGBT of a planar type according to a further embodiment of the present disclosure.

For example, the present applicant has found that the presence of a buried region (for instance, the buried region 44 described with reference to FIG. 2) affords an advantage in terms of improvement (increase in the breakdown voltage) also in the case of IGBT devices without a barrier region that surrounds the body region (for example, in IGBT devices of the type illustrated in FIG. 1a). The present disclosure must consequently be understood as extending to IGBT devices 400 of the type illustrated, by way of example, in FIG. 16. The IGBT device 400 of FIG. 16 is similar to the IGBT device 30 of FIG. 2 (elements that are in common are designated by the same reference numbers). However, what has been described with reference to FIG. 16 is immediately applicable to the embodiments of FIGS. 3, 7, and 9, in a way that will be evident to the person skilled in the branch.

The IGBT device 400 differs from the IGBT device 30 in that it does not comprise the barrier region 42. The buried region 44 consequently extends in the drift region 36 at a distance from the body region 38, for example at a distance of between approximately 1 µm and 5 µm.

Furthermore, for all the embodiments described, the semiconductor regions of a P type can be replaced by respective regions of an N type, and consequently the semiconductor regions of an N type can be replaced by respective regions of a P type.

Furthermore, irrespective of the embodiment, the regions described as insulating regions can be made of any insulating material, for example silicon nitride, TEOS, etc.

In addition, even though explicit reference has been made to semiconductor material such as silicon for the formation of the IGBT devices according to the present disclosure, other types of semiconductor material can be used, for example silicon carbide, gallium nitride, gallium arsenide, and others still.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An insulated gate semiconductor device comprising:
    a semiconductor body having a front side and a back side opposite to one another;
    a drift region, which extends in the semiconductor body and has a first type of conductivity and a first doping value;
    a body region having a second type of conductivity, which extends in the drift region and faces the front side of the semiconductor body;
    a charge carrier region that is a source of charge carriers having the first type of conductivity, the body region housing the charge carrier region;
    a buried region having the second type of conductivity, which extends in the drift region at a distance from the body region and is at least partially aligned to the body region along a first direction orthogonal to the front side and to the back side;
    a collector region positioned adjacent to the back side of the semiconductor body; and
    a first gate terminal extending from the front side of the semiconductor body into the drift region, the first gate terminal being laterally spaced apart from the buried region, in a second direction parallel to the front side of the semiconductor body, by a first portion of the drift region.

2. The device according to claim 1, further comprising a barrier region having the first type of conductivity and a second doping value higher than the first doping value, which extends in the drift region and in direct contact with the body region.

3. The device according to claim 2, wherein the buried region directly contacts the barrier region.

4. The device according to claim 2, wherein the barrier region extends laterally of the buried region and spaces apart the buried region and the first gate terminal in the second direction.

5. The device according to claim 2, wherein the barrier region is an epitaxially grown layer, the device further comprising an annular edge-termination structure that surrounds the body region and has the second type of conductivity, the annular edge-termination structure extending within the barrier region, starting from the front side, throughout a thickness of the barrier region.

6. The device according to claim 2, wherein the buried region is spaced apart from the barrier region.

7. The device according to claim 1, wherein the buried region is spaced apart from the body region by a distance, along said first direction, between approximately 1 µm and approximately 5 µm.

8. The device according to claim 1, wherein the buried region has a maximum thickness, along said first direction, between approximately 3 µm and approximately 9 µm.

9. The device according to claim 1, further comprising an emitter terminal formed on the front side and having an emitter-contact portion in electrical contact with the body region and the charge carrier region, said device being configured for conducting, in use, an electrical current between the emitter terminal and the collector region.

10. The device according to claim 9, wherein said buried region extends to a maximum depth, in said first direction starting from the front side, equal to or smaller than a maximum depth reached by the first gate terminal.

11. The device according to claim 10, further comprising a second gate terminal which extends in depth within the drift region at a distance from the first gate terminal, said buried region extending between the first and second gate terminals, the buried region being laterally spaced apart from the second gate terminal by a second portion of the drift region.

12. A chip comprising:
a first insulated gate semiconductor device formed in a semiconductor body having a front side and a back side opposite to one another, the first insulated gate semiconductor device including:
  a first drift region extending in the semiconductor body and having a first type of conductivity;
  a first body region having a second type of conductivity, which extends in the first drift region and faces the front side of the semiconductor body;
  a first charge carrier region that is a source of charge carriers having the first type of conductivity, the first body region housing the first charge carrier region;
  a first buried region having the second type of conductivity, which extends in the first drift region at a distance from the first body region and is at least partially aligned to the first body region along a first direction orthogonal to the front side and to the back side;
  a first collector region positioned adjacent to the back side of the semiconductor body; and
  a first gate terminal extending from the front side of the semiconductor body into the first drift region, the first gate terminal being laterally spaced apart from the first buried region, in a second direction parallel to the front side of the semiconductor body, by a first portion of the first drift region; and
a second insulated gate semiconductor device formed in the semiconductor body, the second insulated gate semiconductor device including:
  a second drift region extending in the semiconductor body and having the first type of conductivity;
  a second body region having the second type of conductivity, which extends in the second drift region and faces the front side of the semiconductor body;
  a second charge carrier region that is a source of charge carriers having the first type of conductivity, the second body region housing the second charge carrier region;
  a second buried region having the second type of conductivity, which extends in the second drift region at a distance from the second body region and is at least partially aligned to the second body region along the first direction;
  a second collector region positioned adjacent to the back side of the semiconductor body; and
  a second gate terminal extending from the front side of the semiconductor body into the second drift region, the second gate terminal being laterally spaced apart from the second buried region, in the second direction, by a first portion of the second drift region.

13. The chip according to claim 12, wherein the first and second drift regions are part of a common, contiguous drift region and the first and second collector regions are part of a common collector terminal.

14. The chip according to claim 12, wherein the first insulated gate semiconductor device includes a barrier region having the first type of conductivity and a doping value higher than a doping value of the first drift region, the barrier region extending in the first drift region and direct contacts the first body region.

15. The chip according to claim 14, wherein the barrier region extends laterally of the first buried region and spaces apart the first buried region and the first gate region in the second direction.

16. The chip according to claim 14, wherein the barrier region is an epitaxially grown layer, the device further comprising an annular edge-termination structure that laterally surrounds body regions of the first and second insulated gate semiconductor devices and has the second type of conductivity.

17. The chip according to claim 12, wherein said first buried region extends to a maximum depth, in said first direction starting from the front side, equal to or smaller than a maximum depth reached by the first gate terminal.

18. The chip according to claim 12, wherein the first and second insulated gate semiconductor devices share a third gate terminal which extends in depth between the first and second drift regions, the first buried region being laterally spaced apart from the third gate terminal by a second portion of the first drift region, and the second buried region being laterally spaced apart from the third gate terminal by a second portion of the second drift region.

19. A method for manufacturing an insulated gate semiconductor device, comprising:
providing a semiconductor body having a front side and a back side opposite to one another;
forming, in the semiconductor body, a drift region having a first type of conductivity and a first doping value;
forming a body region having a second type of conductivity in the drift region and facing the front side of the semiconductor body;
forming a charge-carrier source region having the first type of conductivity, in the body region;
forming a buried region having the second type of conductivity, in the drift region at a distance from the body region and at least partially aligned to the body region in a first direction orthogonal to the front side and to the back side;
forming a collector region positioned adjacent to the back side of the semiconductor body; and
forming a first gate terminal extending from the front side of the semiconductor body into the drift region, the first gate terminal being laterally spaced apart from the buried region, in a second direction parallel to the front side of the semiconductor body, by a first portion of the drift region.

20. The method according to claim 19, further comprising forming a barrier region having the first type of conductivity and a second doping value higher than the first doping value, in the drift region in direct contact with the body region.

21. The method according to claim 20, wherein forming the buried region includes forming the buried region in direct contact with the barrier region.

22. The method according to claim 20, wherein forming the barrier region includes forming the barrier region extending laterally of the buried region and between the buried region and the first gate region in the second direction.

23. The method according to claim 20, wherein forming the barrier region comprises growing epitaxially on the drift layer a semiconductor layer having the first type of conductivity and the second doping value, the method further comprising forming, in the barrier region, an annular region surrounding the body region and facing the front side of the semiconductor body, said annular region having the second type of conductivity extending throughout a thickness of the barrier region.

24. The method according to claim 19, wherein forming the buried region comprises forming the buried region at a distance from the body region, in said first direction, of between approximately 1 μm and 5 μm.

* * * * *